(12) United States Patent
Tsuto et al.

(10) Patent No.: US 6,769,083 B1
(45) Date of Patent: Jul. 27, 2004

(54) TEST PATTERN GENERATOR, A TESTING DEVICE, AND A METHOD OF GENERATING A PLURALITY OF TEST PATTERNS

(75) Inventors: Masaru Tsuto, Tokyo (JP); Tatsuya Yamada, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/437,249

(22) Filed: Nov. 10, 1999

(30) Foreign Application Priority Data

Nov. 10, 1998 (JP) ........................................ H10-319637
Nov. 1, 1999 (JP) ........................................ H11-310748

(51) Int. Cl.$^7$ ........................... G06F 11/00; G06F 13/28
(52) U.S. Cl. ........................................ 714/738; 710/23
(58) Field of Search ............................... 714/738, 724; 711/100, 147, 148, 154

(56) References Cited

U.S. PATENT DOCUMENTS 5,142,223 A  8/1992  Higashino et al.

FOREIGN PATENT DOCUMENTS

JP  10-153646  6/1998

OTHER PUBLICATIONS

Definite of a word "conventional", Webster's II, New Riverside University Dictionary.*
Patent Abstracts of Japan, Publication No. 10153646 A, Publication date Jun. 9, 1998, 1 page.

P. H. Messmer, "PC Hardwarebuch" $3^{rd}$ Edition, Addison–Wesley Publishing Company, 1995, pp. 253–262 (no english translation).

German Office action dated Jul. 22, 2002, 10 pages w/ no translation of same, 12 pages.

* cited by examiner

*Primary Examiner*—Christine T. Tu
(74) *Attorney, Agent, or Firm*—Rosenthal & Osha L.L.P.

(57) ABSTRACT

A test pattern generator for generating a test pattern for testing electrical characteristics of an electrical device. The test pattern generator comprises a pattern memory (32), a pattern cache memory (54, 180 and 182), a vector memory (12), a read out controller (14 and 170), and a transfer controller (34 and 178). The pattern memory (32) stores the test pattern. The pattern cache memory (54, 180 and 182) stores the test pattern read out from the pattern memory (32). The vector memory (12) stores a vector instruction indicating an order of the test pattern to be generated. The read out controller (14 and 170) judges whether an address of the test pattern to be read out from the pattern memory (32) is to be jumped or not based on the vector instruction read out from the vector memory (12). The transfer controller (34 and 178) reads out the test pattern from the jumped address, and for transferring the jumped address to a pattern cache memory (54, 180 and 182) when the read out controller (14 and 170) judges the address is to be jumped.

11 Claims, 24 Drawing Sheets

| ADDRESS | VECTOR CONTROL | TEST PATTERN | |
|---|---|---|---|
| #0 | GOSUB A | PAT 0 | --- SUB ROUTINE CALL |
| #1 | NEXT | PAT 1 | |
| #2 | NEXT | PAT 2 | TEST1 |
| #3 | REPEAT 3 | PAT 3 | |
| #4 | NEXT | PAT 4 | |
| #5 | GOSUB A | PAT 5 | --- SUB ROUTINE CALL |
| #6 | NEXT | PAT 6 | |
| #7 | NEXT | PAT 7 | |
| #8 | REPEAT 2 | PAT 8 | TEST2 |
| #9 | REPEAT 3 | PAT 9 | |
| #A | NEXT | PAT A | |
| #B | GOSUB A | PAT B | --- SUB ROUTINE CALL |
| #C | NEXT | PAT C | |
| #D | NEXT | PAT D | |
| #E | REPEAT 4 | PAT E | TEST3 |
| #F | NEXT | PAT F | |
| #10 | STOP | PAT 10 | |
| #11 | A:NEXT | PAT 11 | |
| #12 | NEXT | PAT 12 | INITIALIZATION |
| #13 | REPEAT 2 | PAT 13 | |
| #14 | NEXT | PAT 14 | |
| #15 | RETURN | PAT 15 | |

PATTERN PROGRAM

*RELATED ART*

*FIG.2*

| MEMORY ADDRESS | COMPRESSED INSTRUCTION | | |
|---|---|---|---|
| #0 | GOSUB A | #0 | #11 |
| #1 | REPEAT 3 | #3 | |
| #2 | GOSUB A | #5 | #11 |
| #3 | REPEAT 2 | #8 | |
| #4 | REPEAT 3 | #9 | |
| #5 | GOSUB A | #B | #11 |
| #6 | REPEAT 4 | #E | |
| #7 | STOP | #10 | |
| #8 | A:REPEAT 2 | #13 | |
| #9 | RETURN | #15 | |

*RELATED ART*

*FIG.3*

| MEMORY ADDRESS | TEST PATTERN |
|---|---|
| #0 | PAT 0 |
| #1 | PAT 1 |
| #2 | PAT 2 |
| #3 | PAT 3 |
| #4 | PAT 4 |
| #5 | PAT 5 |
| #6 | PAT 6 |
| #7 | PAT 7 |
| #8 | PAT 8 |
| #9 | PAT 9 |
| #A | PAT A |
| #B | PAT B |
| #C | PAT C |
| #D | PAT D |
| #E | PAT E |
| #F | PAT F |
| #10 | PAT 10 |
| #11 | PAT 11 |
| #12 | PAT 12 |
| #13 | PAT 13 |
| #14 | PAT 14 |
| #15 | PAT 15 |

CONVENTIONAL PATTERN GENERATION

| ADDRESS | VECTOR CONTROL | TEST PATTERN | |
|---|---|---|---|
| #0 | NEXT | PAT 0 | |
| #1 | NEXT | PAT 11 | |
| #2 | NEXT | PAT 12 | INITIALIZATION |
| #3 | REPEAT 2 | PAT 13 | |
| #4 | NEXT | PAT 14 | |
| #5 | NEXT | PAT 1 | |
| #6 | NEXT | PAT 2 | |
| #7 | REPEAT 3 | PAT 3 | TEST1 |
| #8 | NEXT | PAT 4 | |
| #9 | NEXT | PAT 5 | |
| #A | NEXT | PAT 11 | |
| #B | NEXT | PAT 12 | INITIALIZATION |
| #C | REPEAT 2 | PAT 13 | |
| #D | RETURN | PAT 14 | |
| #E | NEXT | PAT 6 | |
| #F | NEXT | PAT 7 | |
| #10 | REPEAT 2 | PAT 8 | TEST2 |
| #11 | REPEAT 3 | PAT 9 | |
| #12 | NEXT | PAT A | |
| #13 | NEXT | PAT B | |
| #14 | NEXT | PAT 11 | |
| #15 | NEXT | PAT 12 | INITIALIZATION |
| #16 | REPEAT 2 | PAT 13 | |
| #17 | NEXT | PAT 14 | |
| #18 | NEXT | PAT C | |
| #19 | NEXT | PAT D | |
| #1A | REPEAT 4 | PAT E | TEST3 |
| #1B | NEXT | PAT F | |
| #1C | STOP | PAT 10 | |

*RELATED ART*
*FIG.7*

```
10      STRT:  IDXI  2
11             IDXI  2
12             JSR   SUB1
13             JSR   SUB1
14             STI   3
15      LOOP1: IDXI  4
16             JSR   SUB1
17             IDXI  4
18             JNI   LOOP1
19             IDXI  8
20             STPS
21      SUB1:  IDXI  2    -- START ADDRESS OF SUB
                              ROUTINE PATTERN --
                ⋮
22             STI   2
23      LOOP2: NOP
24             JNI   LOOP2
25             IDXI  4
26             RTN        -- END ADDRESS OF SUB
                              ROUTIN PATTERN --
```

*Fig. 17(a)*

(b)
```
10      STRT:  IDXI  2
11             IDXI  2
12             JSR   SUB3
13             JSR   SUB1
14             STI   3
15      LOOP1: IDXI  4
16             JSR   SUB2
17             IDXI  4
18             JNI   LOOP1
19             JSR   SUB3
20             IDXI  8
21             STPS
22      SUB1:  IDXI  2  -- START ADDRESS OF SUB
23             STI   2       ROUTINE PATTERN --
24      LOOP2: NOP
25             JNI   LOOP2
26             IDXI  4
27             RTN
28      SUB2:  STI   1
29      LOOP3: JNI   LOOP3
30             RTN
31      SUB3:  RTN  -- END ADDRESS OF SUB
                          ROUTIN PATTERN --
```

Fig. 17(b)

```
10  STRT:   JSR SUB1
12          JSR SUB2
14          STPS
16  SUB1:   IDXI 1
18  SUB2:   IDXI 2
            RTN
```

Fig. 21

TEST PATTERN GENERATOR, A TESTING DEVICE, AND A METHOD OF GENERATING A PLURALITY OF TEST PATTERNS

This patent application claims priority based on Japanese patent applications, H10-319637 filed on Nov. 10, 1998, and H11-310748 filed on Nov. 1, 1999, the contents of which are incorporated herein by reference.

BACKGROUND OF THE INVENTION

1. Field of the Invention

The present invention relates to a test device, a test pattern generator for generating test patterns and a method of generating a plurality of test patterns for testing an electrical device.

2. Description of the Related Art

A conventional test pattern generator of a testing device for an electrical device comprises a SRAM or a DRAM having a large capacity to store programs for generating test patterns. The DRAM is used when the capacity of the SRAM is not enough to store necessary programs to generate the test patterns. When the DRAM is used, a test pattern is generated from the DRAM via a cache memory, because the DRAM needs to be refreshed at a predetermined period and there is inconvenient when an address of a different ROW is accessed in using the DRAM.

FIG. 1 is a block diagram of a conventional test pattern generator comprising an SRAM. The conventional test pattern generator comprises a sequence controller 62 and a pattern signal generator 26. The sequence controller 62 comprises a vector memory 12, vector memory banks 16 and 18, a vector instruction multiplexer 20 and an address expander 22. The pattern signal generator 26 comprises a pattern memory using the SRAM. The sequence controller 62 generates address signal 24 in a desired order. When the address signal 24 is successively input to the pattern signal generator 26, each of the memory addresses stored in the pattern signal generator 26 are linked with each of the test patterns, to produce a desired series of test patterns. Thus the test patterns are generated.

The read out controller 14 of the sequence controller 62 reads out the vector instructions stored in the vector memory 12. The vector instructions are temporarily stored in the vector memory banks 16 and 18. The vector instruction multiplexer 20 selects a vector instruction from among the vector instructions temporarily stored in the vector memory banks 16 and 18, and outputs the selected vector instruction to the address expander 22. The address of the address signal 24 is expanded by the address expander 22 and transferred to the pattern signal generator 26. Each of the pattern signals stored in the pattern memory is linked with each of the address signal 24 in the pattern signal generator 26 to generate test pattern signals 28 for testing an electrical device.

FIG. 2 shows an example of a pattern program to be stored in the vector memory 12. The instruction "GOSUB A" means that the routine should go to the sub routine labeled "A". The instruction "RETURN" means that the sub routine should be terminated and the routine should return to the next instruction (at an address one address added to the previous address) of the instruction "GOSUB". The instruction "REPEAT n" means that the test pattern of the indicated address should be output n times. The instruction "NEXT" means that the routine should go to the next address (one address added to the previous address). The instruction "STOP" means that the test should be terminated.

The test patterns for an electrical device are generated by arranging each of the individual test patterns determined by these vector instructions. The instructions of the addresses #11 to address #15 are labeled "A", and function as the sub routines.

FIG. 3 shows an example of a compressed pattern program to be stored in the vector memory. The pattern program of the vector instructions shown in FIG. 2 comprises the instructions "NEXT" which means that the routine should go to the next address. Therefore, the instructions "NEXT" are omitted and the pattern program is compressed, as show in FIG. 3, to be stored in the vector memory. In this application, the instructions "NEXT" are omitted and the pattern program is compressed as a whole. The result is that a small capacity vector memory can serve as the test pattern generator.

The instruction "GOSUB A #0 #11" means that the instruction of the address #0 is "GOSUB A" and the address to which the routine should go is #11. The instruction "REPEAT 3 #3" means that the instruction of the address #3 is "REPEAT 3", so the instruction of the address #3 should be repeated three times. This also means that the instructions of the address #1 and the address #2 are "NEXT". Thus, the pattern program is compressed as a whole.

FIG. 4 shows instructions to be stored in the pattern signal generator 26. Predetermined patterns shown as PAT0, PAT1, ..., PATn are previously stored in an external storage device such as a hard disk, not shown in the drawings. The predetermined patterns are then read out from the hard disk when the device is switched on, and stored in the respective addresses #0, #1, ..., #n of the pattern signal generator 26.

FIG. 5 shows the operation of a conventional test pattern generator. In FIG. 5, each of the vector memory banks 16 and 18 store three words. The pattern generator 60 is initialized before the test is started. At the initialization, the vector instructions are read out from the vector memory 12 having been previously stored in the vector memory bank 16, based on the instructions from the read out controller 14 shown in FIG. 1.

The read out controller 14 shown in FIG. 1 outputs the instructions stored in the vector memory 12 to the vector memory bank 16, taking the sequences into consideration. For example, the instruction "GOSUB A" means that the routine should go to the sub routine labeled "A", therefore the instruction "REPEAT 2 #13" is written next to the instruction "GOSUB A #0 #11".

When the instruction "RPEAT" is output, the routine goes to the next address. The instruction "RETURN #15 #1" is written next to the instruction "REPEAT". The initialization is completed when the first three words are written in the vector memory bank 16. The test is started when the initialization of the test pattern generator 60 is completed. The test proceeds as explained in the following. The address expander 14 shown in FIG. 1 expands the compressed instructions that were stored in the vector memory bank 16, while the test pattern generator 60 is initialized.

The address signal 24 comprising the pattern memory using SRAM is supplied to the pattern former 26. The pattern former 26 outputs the test patterns stored therein based on the address signal 24 and applies the output test pattern signals to the electrical device 76. After the test is started, the vector instruction multiplexer 20 selectively outputs to the address expander 22 the compressed instructions from the vector memory banks in which the vector instructions were previously stored, A program comprising the three words stored in the vector memory bank 16 executes the instructions shown below at the initialization. Firstly, the routine goes to the address #11 from the address #0 by the instruction "GOSUB A #0, #11". The routine then goes from the address #11 to the address #13 in order, and the address #13 is repeated twice by the instruction "REPEAT 2 #13". The routine then proceeds to the address #14. The routine proceeds from the address #14 to the address #15, and goes to the address #1 by the instruction "RETURN #15 #1".

While the test patterns are generated by the vector memory bank 16, the vector instruction to be executed next is transferred from the vector memory 12 to the vector memory bank 18 based on the instructions from the read out controller 14. After the test patterns are generated by the vector memory bank 16, another series of test patterns are generated based on the instructions stored in the vector memory bank 18. While the test patterns are generated by the vector memory bank 18, the vector instruction to be executed next is transferred from the vector memory 12 to the vector memory bank 16, based on the instructions from the read out controller 14. Similarly, another series of test patterns are generated based on the instructions stored in the vector memory bank 16 after the test patterns are generated by the vector memory bank 18.

By repeating these operations, the test patterns are successively output from either of the vector memory banks 16 and 18. The conventional test pattern generator minimizes the pattern program by using the initialize pattern including sub routine such as the instruction "GOSUB" and the "label A" in common. By minimizing the pattern program, the required capacity of the vector memory 12 is minimized.

FIG. 6 shows a block diagram of the conventional pattern former 26 comprising a DRAM. The pattern former 26 comprises a pattern memory 32 composed of the DRAM, a transfer controller 34, multiplexers 36 and 38 for the pattern memory, cache memory banks 40 and 42 for the pattern memory, and a multiplexer 44 for the pattern cache memories.

The pattern former 26 comprising the DRAM generates the test pattern signals from the pattern memory 32 via the cache memories 40 and 42. The operation of the pattern former 26 will be explained in the following. The address signal 24 is transferred to the multiplexers 36 and 38, and the transfer controller 34. When the address signal 24 is input to the multiplexer 44, the multiplexer 44 selects either of the cache memory banks 40 and 42 based on the difference of the former bit and reads out the pattern signals from the selected cache memory bank.

The address signal 24 is also input to the multiplexers 36 and 38, and the transfer controller 34. The transfer controller 34 selects either of the pattern memory banks 40 and 42 from which the pattern signal is then completely read out based on the bits indicating the address. The transfer controller then transfers the next pattern signals from the pattern memory 32 to the selected pattern memory bank 40 or 42 via the multiplexer 44 connected to the selected pattern memory bank 40 or 42. When the address signal is input to the transfer controller 34, the test patterns are selectively transferred to either of the pattern memory banks 40 or 42. The desired test patterns are generated by the multiplexer 44 based on the address information.

When the SRAM is used as the pattern memory of the pattern signal generator 26, the required capacity of the pattern memory is minimized using a sub routine. However, with large scale electrical devices and multifunctional electrical devices, the number of test patterns necessary for testing a single electrical device is increasing. The capacity of the SRAM is not large enough to store these numbers of patterns required. Thus it is required to use a DRAM for the test pattern generator.

FIG. 7 shows a pattern program including the initialize pattern at the start of each test lists. Only successive addresses can be transferred to the cache memory from the DRAM. In the case when only the successive addresses are transferred to the cache memory, it is impossible to include a sub routine. Therefore, in this case, the initialize pattern of each of the test lists is written at the start of each test list without including the sub routine. The result is that a DRAM having an extremely large capacity is required because the DRAM needs to store the initialize pattern for each of the test lists.

SUMMARY OF THE INVENTION

Therefore, it is an object of the present invention to provide a test pattern generator, a memory testing device, and a method of generating a plurality of test patterns which overcome the above issues in the related art. This object is achieved by combinations described in the independent claims. The dependent claims define further advantageous and exemplary combinations of the present invention.

In order to solve the above-stated problem, the present invention provides a test pattern generator for generating a test pattern for testing electrical characteristics of an electrical device comprising: a pattern memory for storing the test pattern; a pattern cache memory for storing the test pattern read out from the pattern memory; a vector memory for storing a vector instruction indicating an order of the test pattern to be generated; a read out controller for judging whether an address of the test pattern to be read out from the pattern memory is to be jumped or not based on the vector instruction read out from the vector memory; and a transfer controller for reading out the test pattern from the jumped address, and for transferring the jumped address to a pattern cache memory when the read out controller judges the address is to be jumped.

The test pattern may comprise a main test pattern and a sub test pattern which is repeatedly incorporated in the main test pattern. The pattern cache memory may comprise a main test pattern cache memory for storing the main test pattern read out from the pattern memory and a sub test pattern cache memory for storing the sub test pattern read out from the pattern memory.

The read out controller may comprise means for detecting an instruction to read out the sub test pattern. The transfer controller may comprise means for transferring the sub test pattern from the pattern memory to the sub test pattern cache memory when the read out controller detects the instruction to read out the sub test pattern.

In order to solve the above-stated problem, the present invention further provides a test pattern generator for generating a test pattern for testing electrical characteristic of an electrical device, the test pattern comprising a main test pattern and a sub test pattern which is repeatedly incorporated in the main test pattern, comprising: a pattern memory for storing the main test pattern and the sub test pattern; a main test pattern cache memory for storing the main test pattern read out from the pattern memory; and a sub test pattern cache memory for storing the sub test pattern read out from the pattern memory.

The main test pattern cache memory may comprise two pattern memory banks. The test pattern generator may further comprise a main test pattern multiplexer for reading out the main test pattern previously stored in one of the pattern memory banks to provide the read out main test pattern to the electrical device while the main test pattern read out from the pattern memory is being transferred to the other of the pattern memory banks.

The sub test pattern cache memory may comprise two pattern memory banks. The test pattern generator may further comprise a sub test pattern multiplexer for reading out the sub test pattern previously stored in one of the pattern memory banks to provide the read out sub test pattern to the electrical device while the sub test pattern read out from the pattern memory is being transferred to the other of the pattern memory banks.

The test pattern generator may further comprise: a vector memory for storing a vector instruction indicating an order of the test pattern to be generated; a read out controller for previously detecting that the sub test pattern is to be generated based on the vector instruction read out from the vector memory; and a transfer controller for transferring the sub test pattern from the pattern memory to the sub test pattern cache memory in a case when the read out controller detects that the sub test pattern is to be generated.

The test pattern generator may further comprise a vector cache memory for storing the vector instruction readout from the vector memory. The read out controller may detect that the sub test pattern is to be generated at a time when the vector instruction read out from the vector memory is being transferred to the vector cache memory.

The test pattern generator may further comprise an address expander generating an address of the test pattern to be read out from the pattern memory based on the vector instruction read out from the vector cache memory.

The vector cache memory may comprise three vector memory banks. The pattern generator may further comprise a vector instruction multiplexer for providing the vector instruction read out from one of the three vector memory banks to the address expander while the vector instruction is written on another one of the vector memory banks.

The read out controller may further comprise means for detecting an end address of the sub test pattern. The transfer controller may transfer a new sub test pattern to be read out, which was detected by the read out controller after the sub test pattern of the end address detected by the read out controller is transferred, to the sub test pattern cache memory.

The sub test pattern cache memory may comprise: a ring buffer capable of outputting the sub test pattern with successively updating the sub test pattern therein; and a fixed buffer capable of outputting the sub test pattern with storing the sub test pattern therein.

The vector instructions may comprise a main routine for reading out the main test pattern from the pattern memory and a sub routine for reading out the sub test pattern from the pattern memory. The transfer controller may store a first part of the sub test pattern successively read out from the pattern memory by the sub routine. The sub test pattern, which is read out by the sub routine from the pattern memory and which is not stored in the fixed buffer, may be successively stored in the ring buffer and output from the ring buffer when the sub routine is executed.

The read out controller may further comprise an information detector for detecting an information of the sub routine stored in the vector memory. The transfer controller may store the sub test pattern in either of the fixed buffer and/or the ring buffer based on the information of the sub routine.

The information detector may detect a start address of the sub routine and stores the sub test pattern read out by a first part of the sub routine from the pattern memory based on the start address.

The information detector may comprise a sub routine number detector for detecting a number of the sub routine stored in the vector memory. The transfer controller may have the fixed buffer store the sub test pattern read out by each of the sub routine of the plurality of the sub routine, when a plurality of sub routine is included.

The sub routine number detector may comprise: a return instruction detector detecting a number of return instructions included in the vector instruction, and a sub routine number storage counting a number of the return instructions.

The sub routine number detector may comprise: a jump instruction detector for detecting a jump instruction included in the vector instruction, a judging unit for judging whether an address appointed by the jump instruction is previously appointed by the jump instruction as a jumped address, and a sub routine number storage for counting a number that the judging unit judges that the address appointed by the jump instruction was not previously appointed as the jumped address.

The judging unit may comprise: a register for storing the address which is judged not to be previously appointed as the jumped address, and an identical detector for detecting when the jump instruction detector detects the jump instruction, whether or not the address stored in the register and an address appointed by the jump instruction are same.

The information detector may comprise a capacity detector for detecting a capacity of the sub test pattern. The test pattern generator may store, when the capacity of the sub test pattern is smaller than a capacity of the sub test pattern cache memory, the sub test pattern in the ring buffer by assuming the ring buffer as a second fixed buffer.

The capacity detector may comprise: a start address detector for detecting a start address of the sub test pattern which is read out by the sub routine at first, and an end address detector for detecting an end address of the sub test pattern which is read out by the sub routine at last. The capacity detector may detects: the capacity of the test pattern by subtracting the start address of the test pattern read out at first from the end address of the test pattern read out at last.

The information detector may detect an information of the sub routine at a time when the vector instruction is being stored in the vector memory.

The fixed buffer may store the sub test pattern in a manner such that a time required to store the sub test pattern stored in the pattern memory to the ring buffer is longer than a time required to output the sub test pattern stored in the fixed buffer.

In order to solve the above-stated problem, the present invention further provides a test pattern generator for outputting a test pattern for testing an electrical device based on a vector instruction including a main routine and a sub routine comprising: a main test pattern cache memory previously provided as an area for storing a main test pattern output based on the main routine; a sub test pattern cache memory previously provided as an area for storing a sub test pattern output based on the sub routine; and outputting: the test pattern stored in the main test pattern cache memory and the sub test pattern cache memory.

The test pattern generator may comprise a read out controller for detecting the sub routine included in the vector instruction, and a transfer controller for having the sub test pattern cache memory store the sub test pattern when the sub routine is detected.

In order to solve the above-stated problem, the present invention further provides a test device for testing electrical characteristics of an electrical device by using a test pattern comprising: a pattern memory for storing a test pattern including an input test pattern to be applied to the electrical device for the test and an expected value pattern output from an normal electrical device when the input test pattern is applied to the normal electrical device; a pattern cache memory for storing the test pattern read out from the pattern memory; a vector memory for storing a vector instruction indicating an order of the test pattern to be generated; a read out controller for judging whether an address of the test pattern to be read out from the pattern memory is to be jumped or not based on the vector instruction read out from the vector memory; a transfer controller for reading out the test pattern from the jumped address and for transferring the jumped address to the pattern cache memory when the read out controller judges the address is to be jumped; a pin data selector for reallocating a physical allocation of at least a signal composing the test pattern read out from the pattern cache memory in accordance with arrangements of electrical terminals of the electrical device; a waveform generator for generating a waveform of the input test pattern included in the test pattern output from the pin data selector; a device acceptor for accepting the electrical device and applying the input test pattern generated by the waveform generator to the electrical device; and a comparing unit for comparing an output signal output from the electrical device by applying the input test pattern and the expected value pattern.

In order to solve the above-stated problem, the present invention provides a test device for testing electrical characteristic of an electrical device by using a test pattern, the test pattern comprising a main test pattern and a sub test pattern which is repeatedly incorporated in the main test pattern, each of the main test pattern and the sub test pattern respectively comprising an input test pattern to be applied to the electrical device for the test and an expected value pattern output from a normal electrical device when the input test pattern is applied to the normal electrical device, comprising: a pattern memory for storing the main test pattern and the sub test pattern; a main test pattern cache memory for storing the main test pattern read out from the pattern memory; a sub test pattern cache memory for storing the sub test pattern read out from the pattern memory; a multiplexer for selecting either of the main test pattern read out from the main test pattern cache memory and the sub test pattern read out from the sub test pattern cache memory; a pin data selector for reallocating a physical allocation of at least a signal composing the test pattern selected by the multiplexer in accordance with arrangements of electrical terminals of the electrical device; a waveform generator for generating a waveform of the input test pattern included in the test pattern output from the pin data selector; a device acceptor for accepting the electrical device and applying the input test pattern generated by the waveform generator to the electrical device; and a comparing unit for comparing an output signal output from the electrical device by applying the input test pattern and the expected value pattern.

In order to solve the above-stated problem, the present invention provides a test device for testing electrical characteristics of an electrical device by using a test pattern, the test pattern being generated based on a vector instruction including a main routine and a sub routine, the test pattern comprising a main test pattern and a sub test pattern which is repeatedly incorporated in the main test pattern, each of the main test pattern and the sub test pattern respectively comprising an input test pattern to be applied to the electrical device for the test and an expected value pattern output from a normal electrical device when the input test pattern is applied to the normal electrical device, comprising: a test pattern generator for storing a main test pattern appointed by the main routine in and outputting the stored main pattern from a memory previously provided for main routine and for storing a sub test pattern appointed by the sub routine in and outputting the stored main pattern from a memory previously provided for sub routine; a multiplexer selecting either of the main test pattern read out from the memory provided for the main routine, and the sub test pattern read out from the memory provided for the sub routine; a pin data selector for reallocating a physical allocation of at least a signal composing the test pattern selected by the multiplexer in accordance with arrangements of electrical terminals of the electrical device; a waveform generator for generating a waveform of the input test pattern included in the test pattern output from the pin data selector; a device acceptor for accepting the electrical device and applying the input test pattern generated by the waveform generator to the electrical device; and a comparing unit for comparing an output signal output from the electrical device by applying the input test pattern and the expected value pattern.

In order to solve the above-stated problem, the present invention provides a method of generating a test pattern for electrically testing an electrical device comprising: a reading out step of reading out a vector instruction indicating an order of the test pattern to be generated from a vector memory storing the vector instruction; a judging step of judging whether an address of the test pattern to be read out from the pattern memory is to be jumped or not based on the vector instruction read out from the vector memory; and a transferring step of reading out the test pattern from the jumped address and transferring the jumped address to a pattern cache memory when the read out controller judges the address is to be jumped.

The test pattern may comprise a main test pattern and a sub test pattern which is repeatedly incorporated in the main test pattern. The judging step may judge whether the sub test pattern is read out or not. The transferring step may comprise steps of: storing the main test pattern read out from the pattern memory in a main test pattern cache memory provided in the pattern cache memory; and storing the sub test pattern read out from the pattern memory in a sub test pattern cache memory provided in the pattern cache memory.

The judging step may comprise a step of detecting an instruction to read out the sub test pattern. The transferring step may transfer the sub test pattern from the pattern memory to the sub test pattern cache memory when the instruction to read out the sub test pattern is detected in the judging step.

In order to solve the above-stated problem, the present invention further provides a method of generating a test pattern for electrically testing an electrical device, the test pattern comprising a main test pattern and a sub test pattern which is repeatedly incorporated in the main test pattern comprising steps of: reading out the main test pattern from a pattern memory storing the main test pattern and the sub test pattern and transferring the main test pattern to a main test pattern cache memory; and reading out the sub test pattern from the pattern memory and transferring the sub test pattern to a sub test pattern cache memory.

The main test pattern cache memory may comprise two pattern memory banks. The method of generating a test pattern may further comprise a step of reading out the main test pattern previously stored in one of the pattern memory banks to provide the read out main test pattern to the electrical device while the main test pattern read out from the pattern memory is being transferred to the other of the pattern memory banks.

The sub test pattern cache memory may comprise two pattern memory banks. The method of generating a test pattern may further comprise a step of reading out the sub test pattern previously stored in one of the pattern memory banks to provide the read out sub test pattern to the electrical device while the sub test pattern read out from the pattern memory is being transferred to the other of the pattern memory banks.

The method of generating a test pattern may further comprise: a reading out step of reading out a vector instruction indicating an order of the test pattern to be generated from a vector memory storing the vector instruction; a detecting step of previously detecting that the sub test pattern is to be generated based on the read out vector instruction; and a transferring step of transferring the sub test pattern from the pattern memory to the sub test pattern cache memory in case when the sub test pattern is detected to be generated.

The method of generating a test pattern may further comprise a step of storing the vector instructions read out from the vector memory in the reading out step in a vector cache memory.

The method of generating a test pattern may further comprise an address generating step of generating an address of the test pattern to be read out from the pattern memory based on the vector instruction read out from the vector cache memory.

The vector cache memory may comprise three vector memory banks. The address may be generated by the vector instruction read out from one of the vector memory banks while the vector instruction being written on another one of the vector memory banks in the address generating step.

The method of generating a test pattern may further comprise a detecting step of detecting an end address of the sub test pattern, wherein the transferring step transfers a new sub test pattern from the pattern memory to the sub test pattern cache memory when the new sub test pattern detected to be read out in the detecting step after the sub test pattern of the end address is transferred.

The sub test pattern cache memory may comprise: a ring buffer capable of outputting the sub test pattern with successively updating the sub test pattern therein; and a fixed buffer capable of outputting the sub test pattern with storing the sub test pattern therein. The vector instructions may comprise a main routine for reading out the main test pattern from the pattern memory and a sub routine for reading out the sub test pattern from the pattern memory. The step for storing in the sub test pattern cache memory may comprise: a step of storing a first part of the sub test pattern successively read out from the pattern memory by the sub routine in the fixed buffer, and, a step of successively storing the sub test pattern, which is read out by the sub routine from the pattern memory and which is not stored in the fixed buffer in the ring buffer.

In order to solve the above-stated problem, the present invention provides a cache device for temporarily storing a group of data stored in a data storing unit and outputting the group or data comprising: a fixed buffer temporarily storing a part of data included in the group of data; a ring buffer for successively updating a part of data other than the part of data stored in the fixed buffer and included in the group of data and outputting the group of data; and a transfer controller for having the fixed buffer store a first part of the group of data and having the ring buffer store a part of data other than the first part of the group of data; wherein the fixed buffer and the ring buffer output the stored data.

The data storing unit may comprise a first group of data and a second group of data. The transfer controller may have the fixed buffer store a first part of each of the first group of data and the second group of data.

The data to be stored in the fixed buffer and /or the ring buffer may be read out from the data storing unit in a same order as an order of the data to be output from the cache device.

BRIEF DESCRIPTION OF THE DRAWINGS

FIG. 2 shows an example of a pattern program to be stored in the vector memory 12;

FIG. 3 shows an example of a compressed pattern program to be store in the vector memory;

FIG. 4 shows an instruction to be stored in the pattern signal generator;

FIG. 7 shows a pattern program including an initialize pattern at the start of each test list, without using sub routine;

FIG. 17(a) shows an example of a vector instruction supplied from the external memory 10;

FIG. 17(b) is an example of the instructions including three sub routines;

FIG. 19 is a block diagram of an embodiment of the start address detector 188a;

FIG. 21 shows an example of the vector instructions supplied from external memory 10;

DETAILED DESCRIPTION OF THE INVENTION

The invention will now be described based on the preferred embodiments. This does not intend to limit the scope of the present invention, but exemplify the invention. All of the features and the combinations thereof described in the embodiment are not necessarily essential to the invention.

Figure 8:
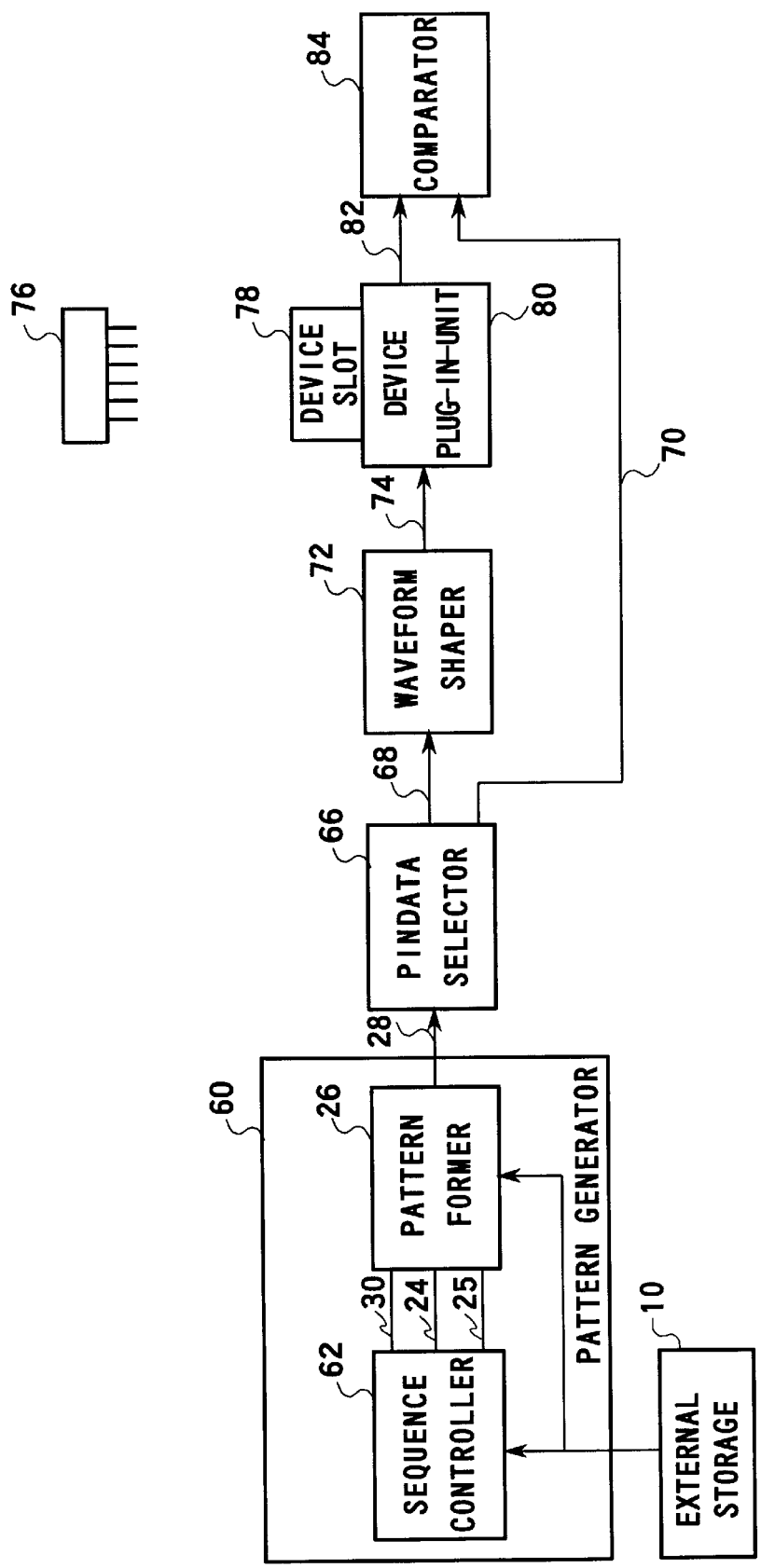
FIG. 8 is a block diagram showing the whole of test device according to the present invention.

FIG. 8 is a block diagram of a test device according to the present invention. The test device according to the present invention comprises a pattern generator 60, a pin data selector 66, a waveform generator 72, a device acceptor 80 having a device slot 78, and a comparing unit 84. The test pattern generator 60 includes a sequence controller 62 and a pattern former 26. The pattern generator 60 transfers test patterns to the pin data selector 66. The test patterns include input test patterns to be applied to an electrical device 76 for testing the electrical characteristics of the electrical device 76. The test patterns also include expected value patterns which are the same as the test patterns output from a normal electrical device when the input test patterns are applied to the normal electrical device.

"Electrical device" includes any electrical parts operated in accordance with electricity or voltage in this application. The electrical device includes a passive element and various sensors, in addition to semi-conducting parts composed of an active element such as an IC and an LSI. Furthermore, the electrical device includes a package in which the passive elements and the semi-conducting parts are assembled and a breadboard on which the passive elements and the semi-conducting parts are loaded to show a predetermined function. "Test pattern" means a temporal and spatial allocation of digital signals to be input to the electrical device, and output digital signals expected to be output for testing the electrical device. Furthermore, "expected value pattern" means a temporal and spatial allocation of output digital signals expected to be output from the electrical device when a predetermined signal is input to the electrical device.

The pin data selector 66 reallocates a physical allocation of at least a signal, composing the test patterns transferred from the pattern generator 60, in accordance with the arrangement of the electrical terminals of the electrical device 76. The pin data selector 66 also transfers an expected value pattern to the comparing unit 84 and the test pattern to the waveform generator 72. The waveform generator 72 generates a waveform of the input test pattern included in the test pattern output from the pin data selector 66, and transfers the waveform to the device acceptor 80. The electrical device 76 is inserted into the device slot 78 of the device acceptor 80. The device acceptor 80 applies the test pattern transferred from the waveform generator 72 to the input terminals of the electrical device 76 via the device slot 78. The electrical device 76 outputs to the comparing unit 84 an output pattern from the output terminals, based on its function.

The comparing unit 84 compares the output pattern output from the electrical device 76 and the expected value pattern transferred from the pin data selector 66. The comparing unit 84 judges that the electrical device 76 has normal function when the output pattern and the expected value pattern are the same. The comparing unit 84 judges that the electrical device 76 does not have normal function when the output pattern and the expected value pattern are not the same. All of the test patterns and the expected value patterns should be previously stored in the test pattern generator 60. However, when the capacity of the pattern memory 32 is not enough, the data of the pattern memory 32 can be rewritten.

Figure 9:
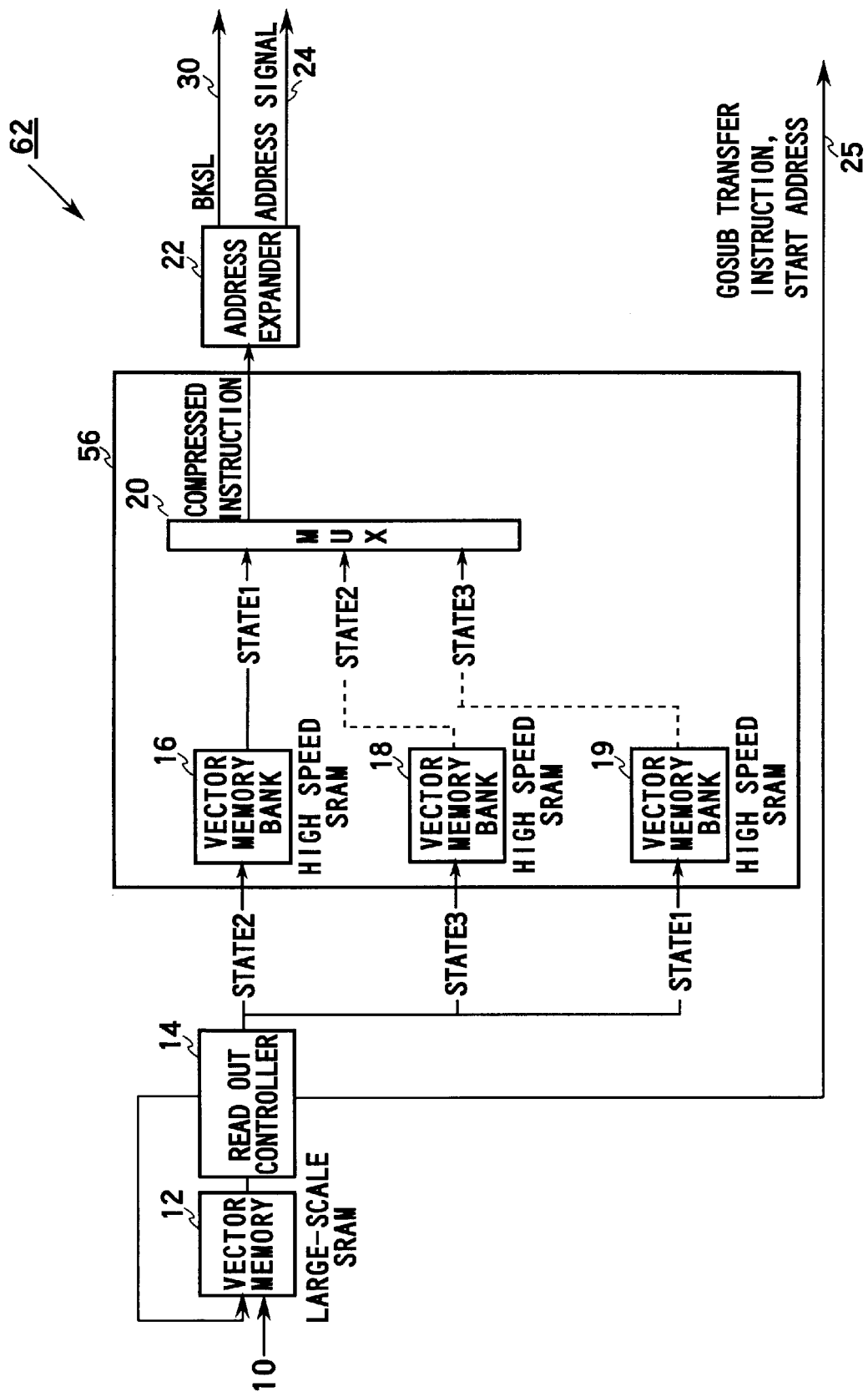
FIG. 9 is a block diagram of a sequence controller of the test pattern generator according to the present invention.

FIG. 9 is a block diagram of the sequence controller of the pattern generator according to the present invention. The sequence controller 62 comprises a vector memory 12, a read out controller 14, a vector cache memory 56 having three vector memory banks 16, 18 and 19 and a vector instruction multiplexer 20, and an address expander 22. The read out controller 14 reads out the vector instruction stored in the vector memory 12. The read out vector instruction is temporarily stored in the vector memory banks 16, 18 and 19.

The read out controller 14 transfers the transfer instruction "GOSUB" and the start address signal 25 to the pattern generator 26 when the readout vector instruction is "GOSUB". The vector instruction multiplexer 20 selects a vector instruction from among the vector instructions temporarily stored in the vector memory banks 16, 18 and 19 and transfers the selected vector instruction to the address expander 22. The address expander 22 transfers a BKSL signal 30 which instructs the selection of the cache memory bank in the pattern former 26, and expanded address signal 24 to the pattern former 26.

Figure 10:
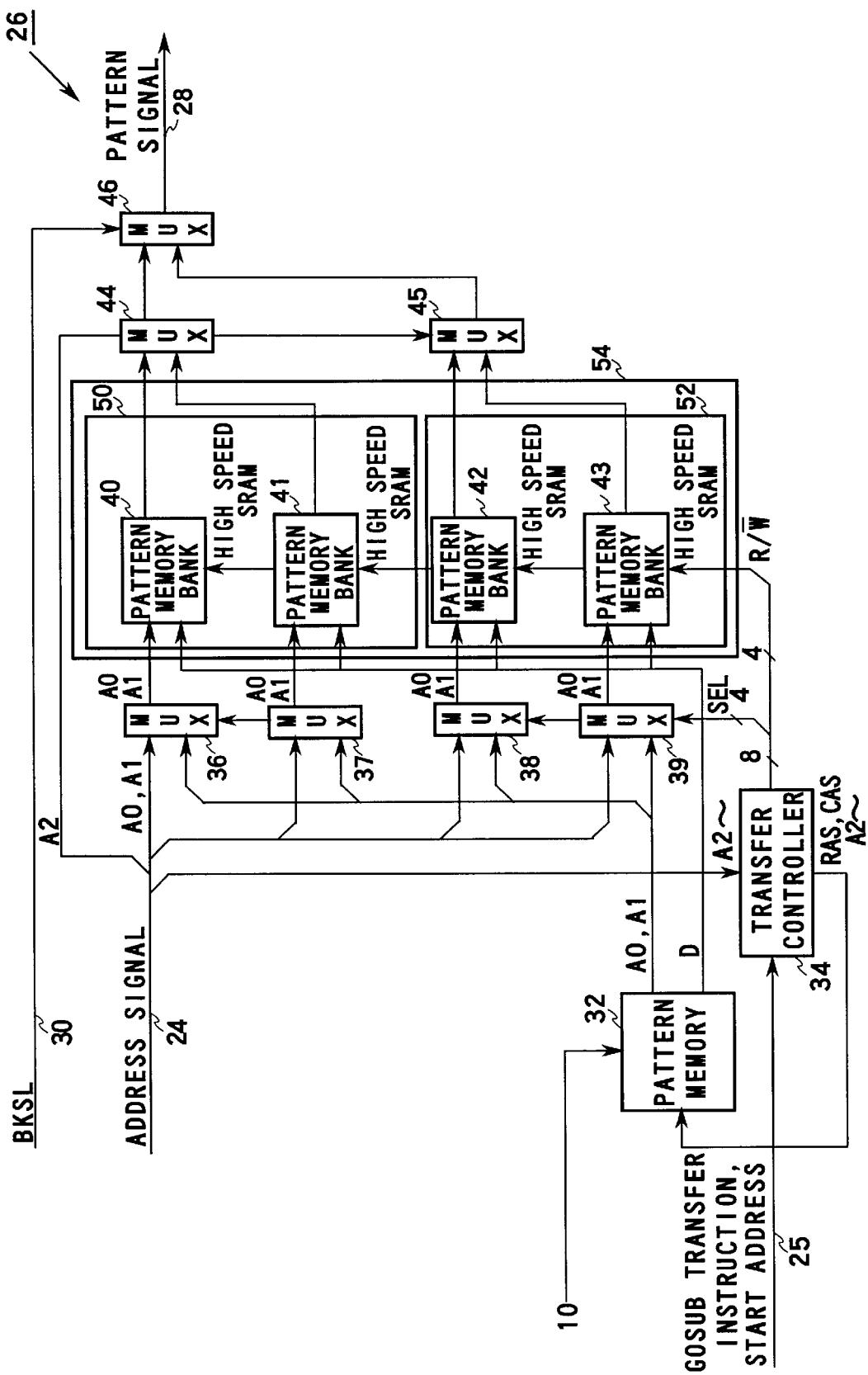
FIG. 10 is a block diagram of a pattern former of the test pattern generator according to the present invention.

FIG. 10 is a block diagram of the pattern former of the test pattern generator according to the present invention. The pattern former 26 of the test pattern generator comprises a pattern memory 32, a transfer controller 34, pattern memory multiplexers 36, 37 and 38, a pattern cache memory 54, and multiplexers 44, 45 and 46. The pattern cache memory 54 comprises a main test pattern cache memory 50 and a sub test pattern cache memory 52.

The main test pattern cache memory 50 comprises two pattern memory banks 40 and 41. The sub pattern cache memory 52 comprises two pattern memory banks 42 and 43. When the address signal 24 is input to the transfer controller 34, the test pattern is read out from the pattern memory 32 in accordance with the input address signal, and transferred to one of the pattern memory banks 40 to 43. The multiplexers 36 to 39 and the multiplexers 44 and 45 select the input data in accordance with the address signal 24.

Figure 1:
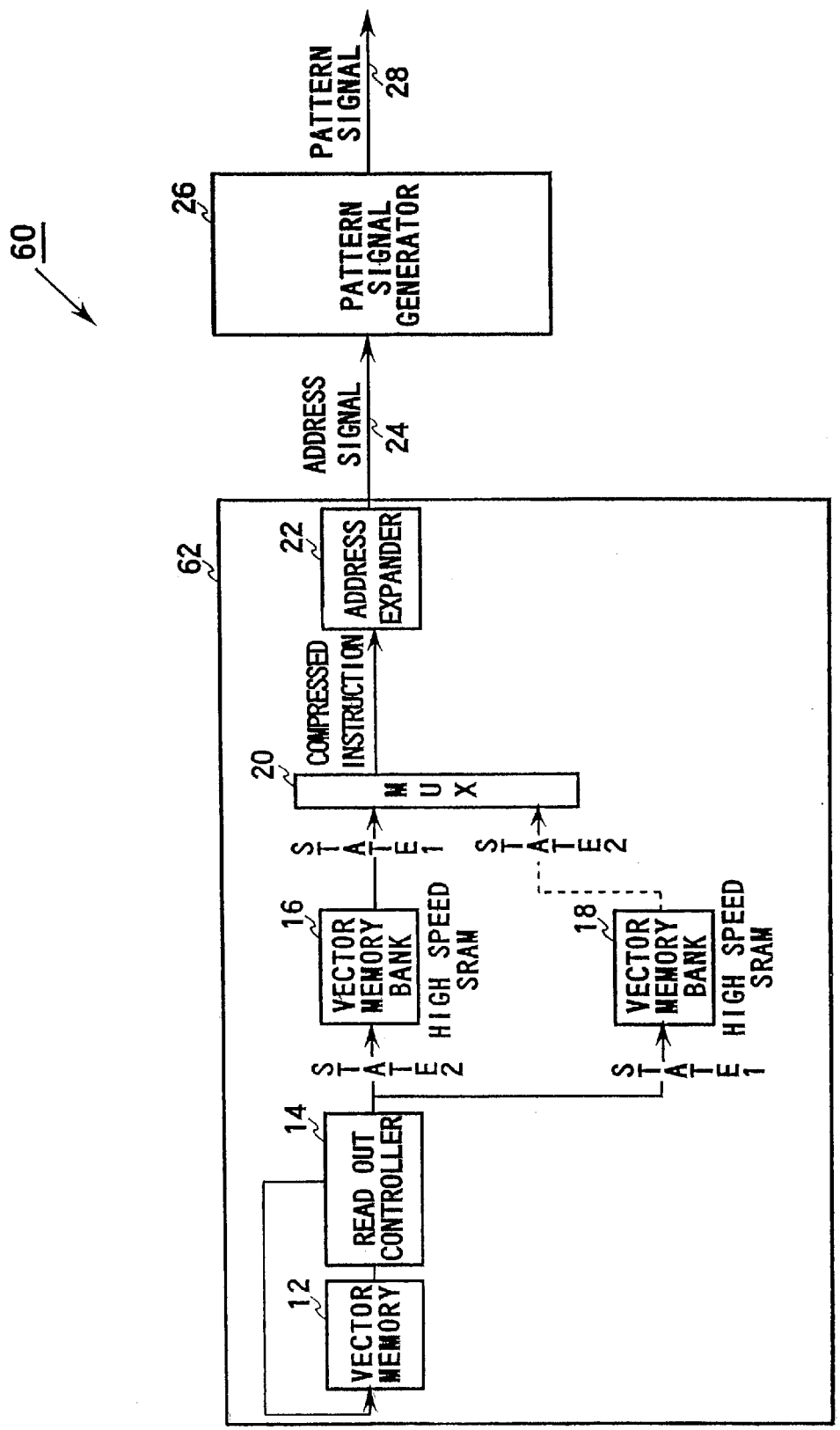
FIG. 1 is a block diagram of a conventional test pattern generator comprising an SRAM.
Figure 5:
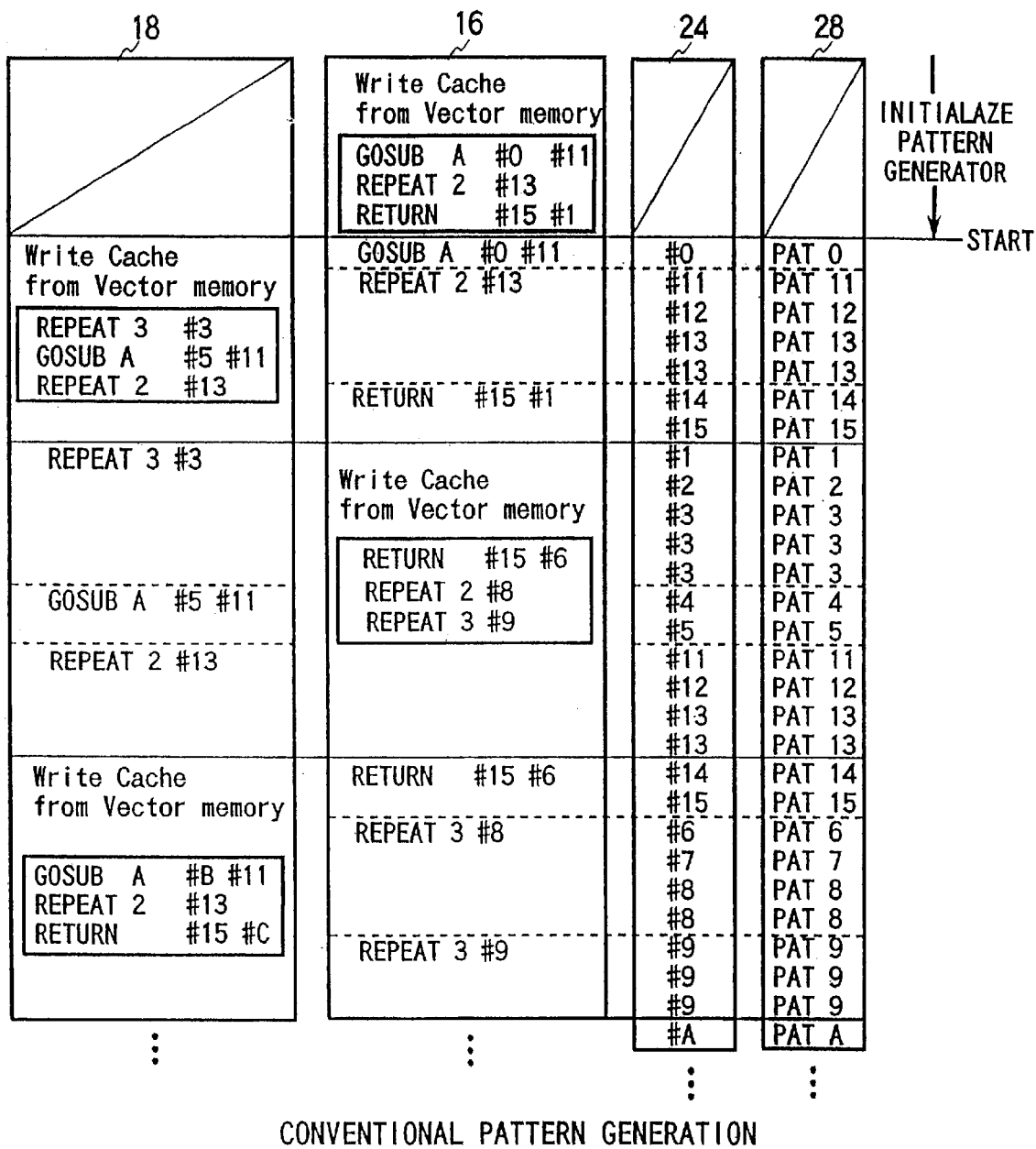
FIG. 5 shows an operation of a conventional test pattern generator.
Figure 6:
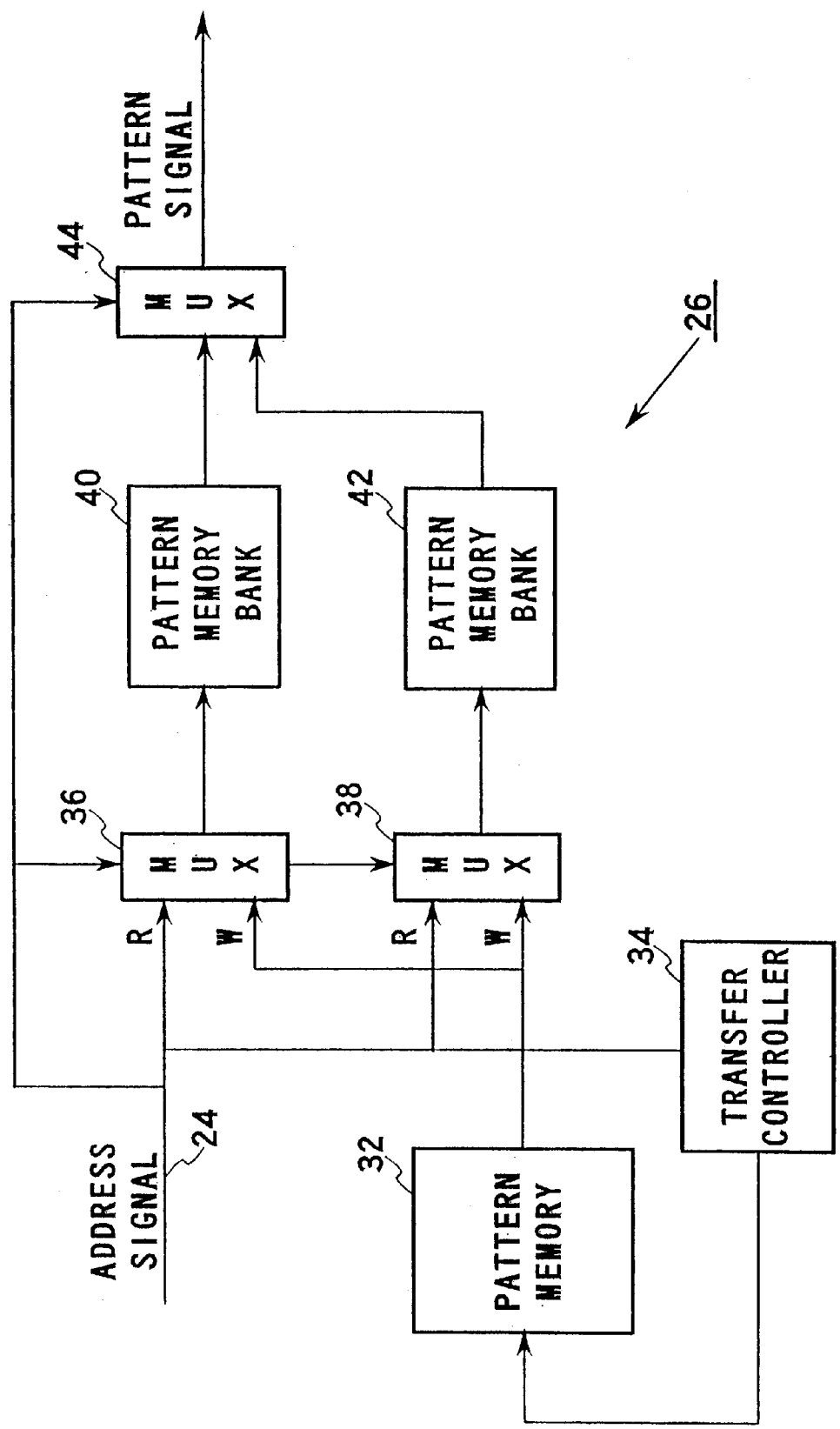
FIG. 6 is a block diagram of a conventional pattern former 26 comprising a DRAM.
Figure 11:
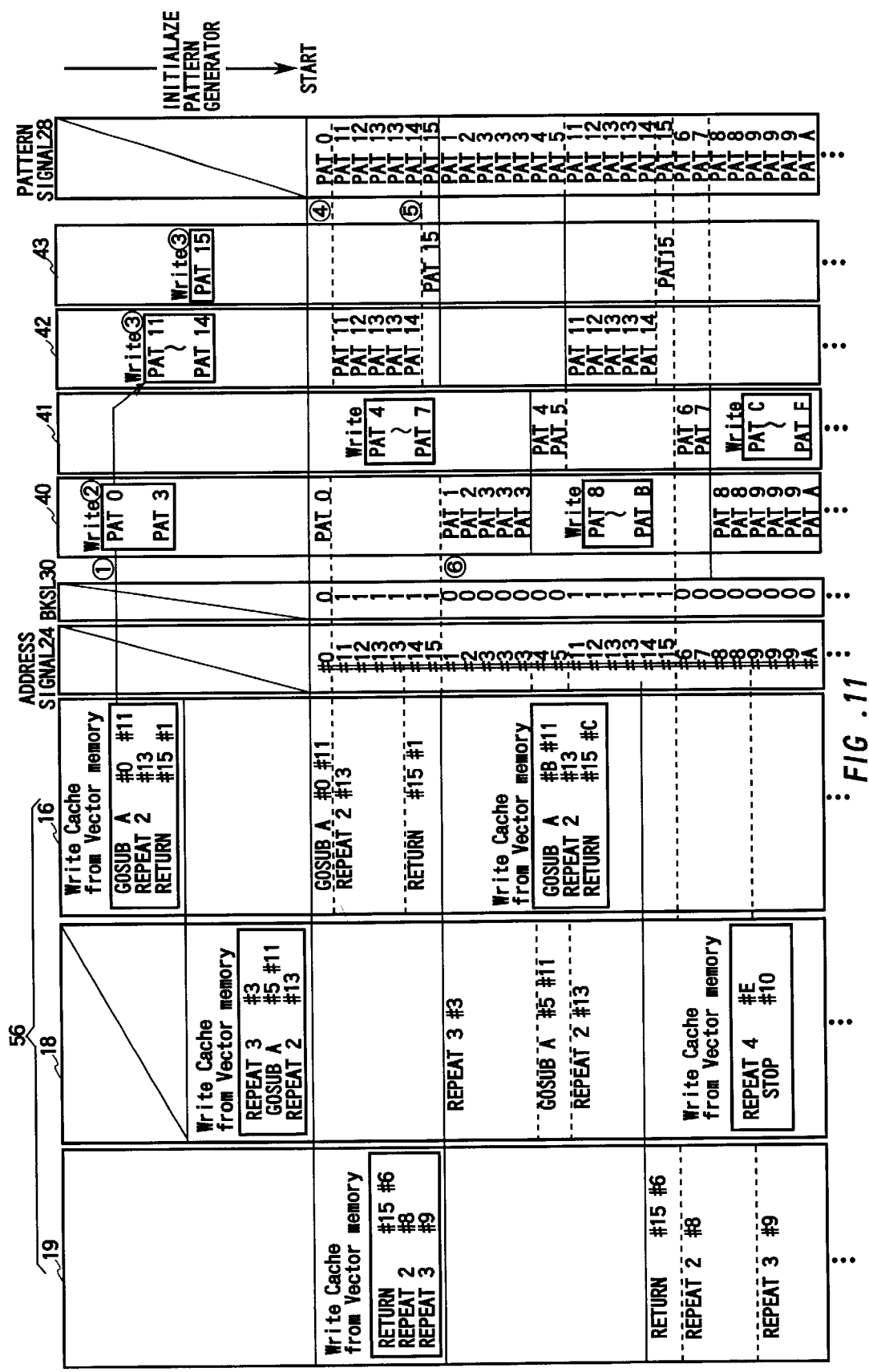
FIG. 11 shows an operation of the test pattern generator according to the present invention.

FIG. 11 shows an example of the operation of a test pattern generator for testing an electrical device, according to the present invention. The operation of the test pattern generator 60 according to the present invention will be explained in the following, based on FIG. 11, with reference to the sequence controller 62 shown in FIG. 9 and the pattern former 26 shown in FIG. 10. The pattern generating program of this example is the same as that shown in FIG. 5. The number of words of the memory is the same as that shown in FIG. 5. The compressed instructions are also the same as those shown in FIG. 3.

The vector cache memory 56 of the sequence controller comprises three vector memory banks. The address expander 22 expands the vector instruction which is a compressed instruction stored in the vector memory bank 16. The address expander 22 also sets the BKSL signal 30 as "1" based on the instruction "GOSUB", and sets the BSKL signal 30 as "0" based on the instruction "RETURN". The address expander 22 then transfers the BSKL signal 30 to the multiplexer 46. The multiplexer 46 selects the multiplexer 44 when the value of the BKSL signal 30 is "1", and selects the multiplexer 45 when the value of the BKSL signal 30 is "0". The initialization of the test pattern generator 60 will be explained in the following. The read out controller 14 initializes the test pattern generator 60 by transferring the first three words to the vector memory bank 16, and the next three words to the vector memory bank 18.

The first vector instruction is "GOSUB A #0 #11" as shown in FIGS. 2, 3 and 11. The operation for initializing the test pattern generator 60 will be explained in the following. The transfer controller 34 transfers the address #0 to the pattern memory 32 when the transfer controller 34 receives the address #0. The address #0 selects one of the multiplexers 36 to 39, and functions to select the main test pattern cache memory 50. The address data #0 transferred from the pattern memory 32 on the other hand selects the multiplexer 36 to have the data written in the bank memory 40 included in the main test pattern cache memory 50.

In the pattern former 26, at the initialization of the test pattern generator 60, four successive data, from the test pattern "PAT 0" to "PAT 3", are transferred from the pattern memory 32 to the pattern cache memory 54 and written to the pattern memory bank 40 of the main test pattern cache memory 50. Here, the test pattern "PAT 0" is corresponding to the address #0.

When the read out controller 14 detects the instruction "GOSUB", the read out controller 14 transfers the GOSUB transfer instruction and the transfer start address signal 25 to the transfer controller 34. Therefore, the transfer controller 34 knows that the instruction "GOSUB" is received by the read out controller 14 and the address jumped by the instruction "GOSUB" is the address #11. After the data of the "PAT0" to "PAT3" is transferred to the pattern memory bank 40, the transfer controller 34 controls the pattern memory 32 to transfer to the pattern cache memory 50 four successive data "PAT11" to "PAT14", corresponding to the address #11 of the sub routine.

The "PAT11" to "PAT14" are then written on the pattern memory bank 42 of the sub test pattern cache memory 52 based on the instruction by the transfer controller 34. The next data "PAT15" of the sub routine is written on the pattern memory bank 43. In this case either of the pattern memory banks 42 and 43 are selected by switching either of the multiplexers 38 and 39 at one address ahead of the end address of the addresses to be input into each of the pattern memory banks.

The operation after the initialization will be explained next. The test is started after the initialization. The address expander 22 expands the instructions stored in the vector memory bank 16 to an address signal 24 in a conventional manner. The first three words of the instructions are expanded as #0, #11, #12, #13, #13, #14# and #15 as shown in FIG. 2, FIG. 3 and FIG. 11. The expanded address signal 24 is transferred to the pattern former 26.

The BKSL signal decides which of the pattern memory banks 40 and 41, and pattern memory banks 42 and 43 are to be used. The appointed address is #0 and the BKSL is "0" initially. Therefore, when the test is started, the data "PAT0" to "PAT3" stored in the pattern memory bank 40 of the main test pattern cache memory 50 is read out from the pattern memory bank 40, to generate the pattern. These operations are repeated until the instruction "GOSUB" to go to the sub routine is made.

Initially however, the vector instruction is the instruction "GOSUB" to jump to the address #11 as shown in FIG. 11. The address expander 22 sets the BKSL signal as "1" and transfers it to the pattern former 26. The multiplexer 46 transfers the pattern cache memory 54 to the sub test pattern cache memory 52 including the memory banks 42 and 43. The test patterns of the jumped address when the instruction "GOSUB" is executed are stored in the memory bank42 and the memory bank43. The multiplexer 45 selects the memory bank42 in accordance with the next address #11. The multiplexer 45 selects the memory bank 43 when the test patterns stored in the memory bank 42 are output completely.

As described above, the sub routine is executed to the last vector instruction stored in the vector memory bank 16 which is the instruction "RETURN". By executing the instruction "RETURN" stored in the vector memory bank 16, the BKSL is set as "0" and the main test pattern cache memory 50 is selected next. Meanwhile, next four data after the "PAT3" which are the "PAT4" to "PAT7" are transferred to and stored in the pattern memory bank 41 of the pattern former 26. The next three words of the vector instructions shown as "RETURN #15 #6", "REPEAT2 #8" and "REPEAT3 #9" in FIG. 11 are transferred to and stored in the vector memory bank 19.

By repeating the same operations, the pattern program comprising sub routines as shown in FIG. 11 can be executed. FIG. 11 shows an example when the instruction "GOSUB" is generated while initializing the test pattern generator. However, the case may occur in which the instruction "GOSUB" is not generated while initializing the test pattern generator. Instead, the transfer instruction "GOSUB" is generated while the test patterns are generated after the initialization.

In such a case, the data should be transferred to the sub test pattern cache memory 52 after the data is transferred to the main test pattern cache memory 50, the same as the case in which the instruction "GOSUB" is generated while initializing the test pattern generator. While one bank of the data is read out, the sub routine pattern can be transferred to the sub test pattern cache memory 52. In this case, the test patterns composed of DRAM transferred from the pattern memory 32 to one of the pattern memory banks 40 to 43 always have successive addresses. Therefore, the data can be transferred at a high speed by multiplexing the data.

Figure 12:
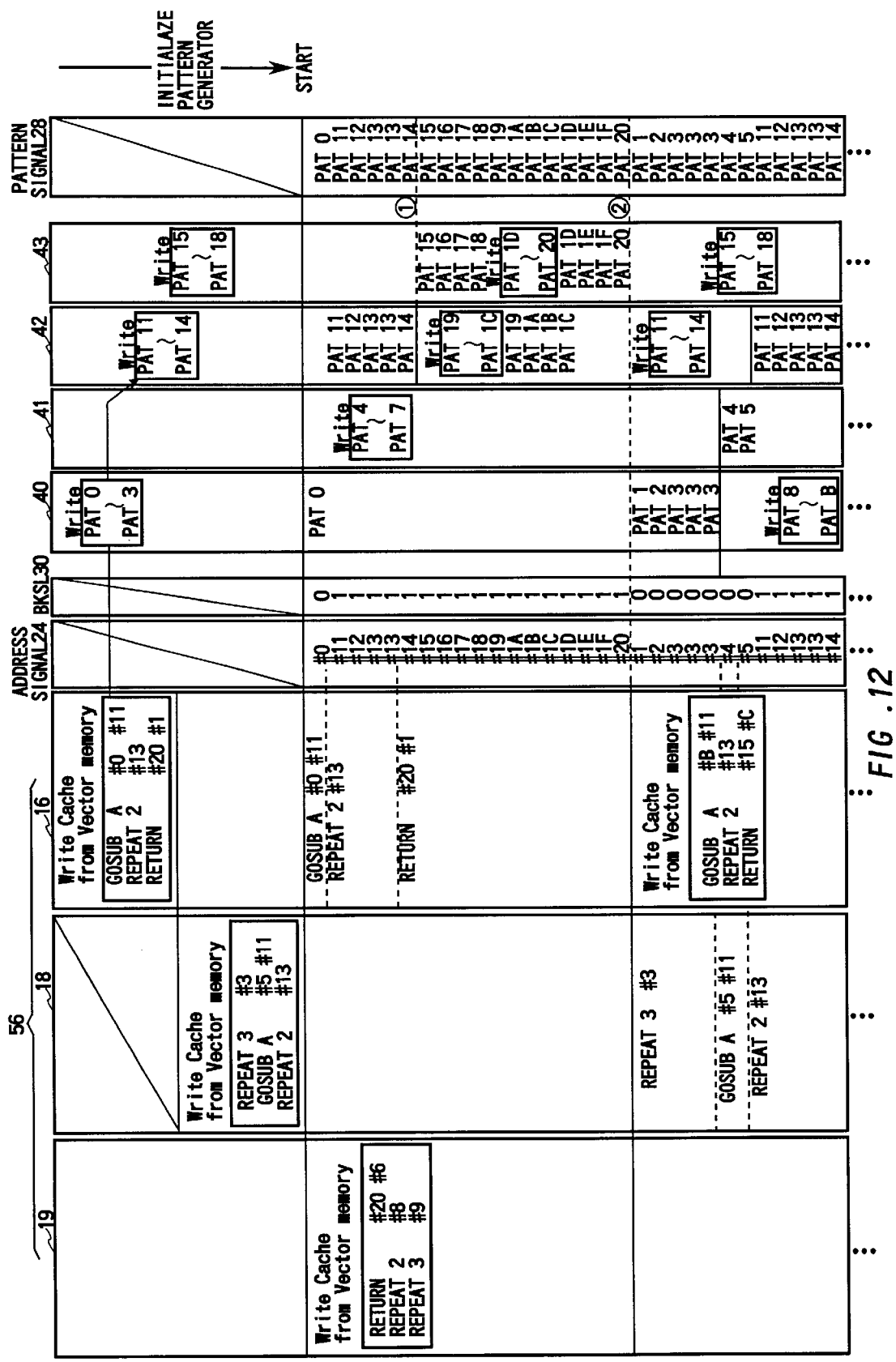
FIG. 12 shows another operation of the test pattern generator according to the present invention.

FIG. 12 shows an example of the operation of the test pattern generator for testing an electrical device according to the present invention. In FIG. 12, there are more patterns for the sub routine than in the case in which the sub test pattern cache memory 52 comprises two pattern memory banks, each storing four successive patterns. The patterns for the sub routine from "PAT11" to "PAT20" are shown. In this case, a part of the sub routine is stored in the pattern memory banks 42 and 43 while the test pattern generator 60 is being initialized. After the patterns from the pattern memory bank 42 are generated, the next patterns are stored in the pattern memory bank 42.

When the instruction "RETURN" stored in the vector memory bank is expanded and executed, the test patterns from the beginning of the sub routine are transferred to the sub test pattern cache memory 52. The second "WRITE" instruction in the pattern memory bank 42, PAT11 to PAT14, shown in FIG. 11, is provided for the case in which the instruction "GOSUB" is read out from the vector memory 12 to be stored in the vector memory bank. The result is, the initialize pattern can be executed by sub routines.

Figure 13:
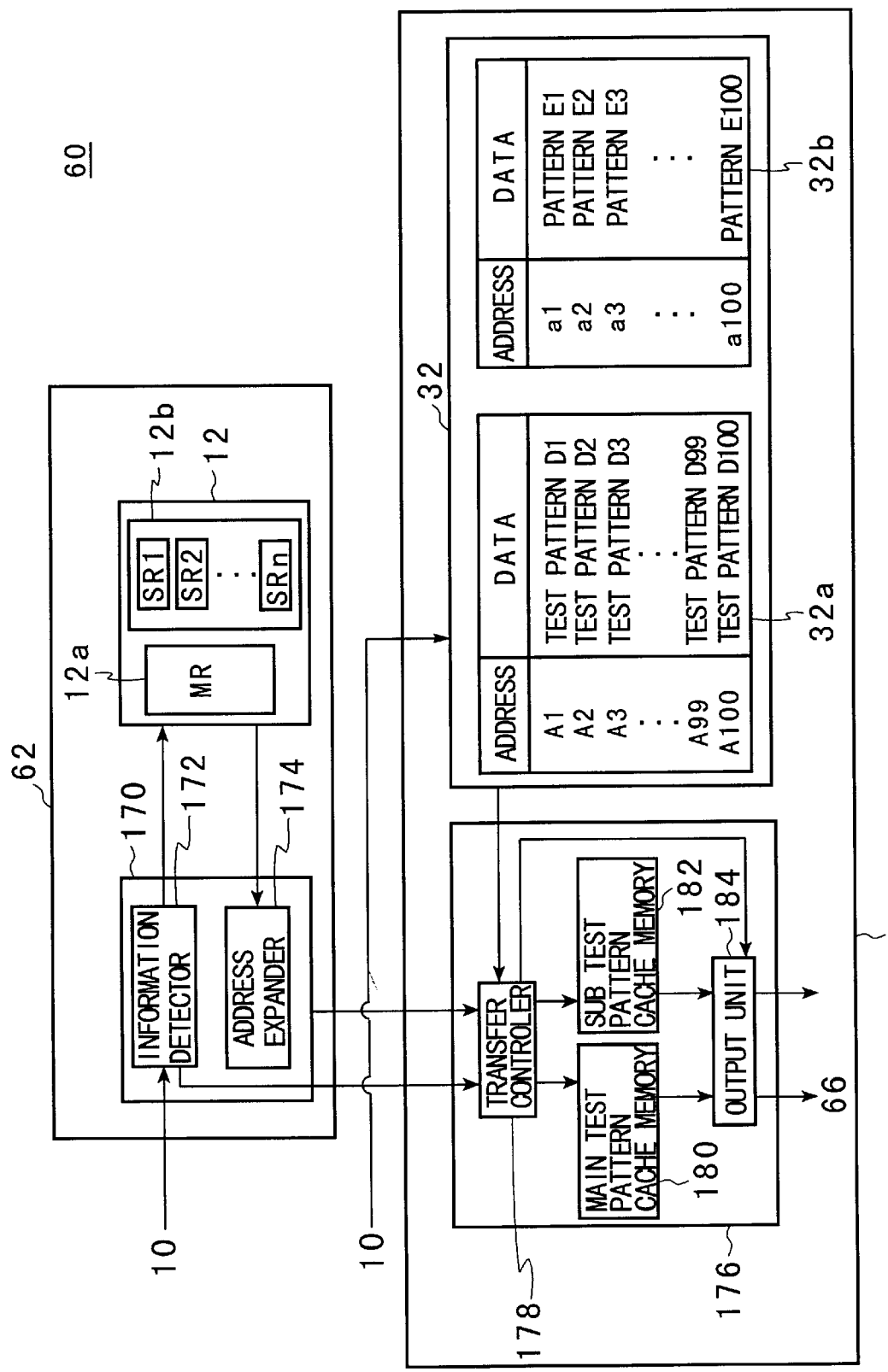
FIG. 13 is a block diagram showing an embodiment of the test pattern generator.

FIG. 13 is a block diagram of another embodiment of the test pattern generator 60. The test pattern generator 60 comprises a read out controller 170, vector memory 12, a data transfer unit 176 and a pattern memory 32. The read out controller 170 comprises an information detector 172 and an address expander 174. The vector memory comprises a main routine 12a and a sub routine 12b. The sub routine 12b includes a sub routine SR1, sub routine SR2, . . . , sub routine SRn. The sub routine 12b may not include a plurality of sub routines in another embodiment. The data transfer unit 176 comprises a transfer controller 178, a main test pattern cache memory 180, a sub test pattern cache memory 182 and an output unit 184. The pattern memory 32 comprises a test pattern 32a and an expected value pattern 32b.

The pattern memory 32 stores the test pattern 32a and the expected value pattern 32b supplied from the external memory 10. The vector memory 12 stores the vector instructions supplied from the external memory 10. The vector instructions include the main routine 12a and the sub routine 12b read out while the main routine 12a is being executed.

The information detector 172 of the readout controller 170 detects the information of the sub routine 12b included in the vector instructions supplied from the external memory 10. The information detector 172 detects the number of the sub routine 12b and outputs the sub routine number to the transfer controller 178. The information detector 172 may also detect the capacity of the test pattern and the expected value pattern read out by the sub routine 12b, and outputs the detected capacity to the transfer controller 178. The information detector 172 preferably detects the information of the sub routine 30b when storing the instruction supplied from the external memory 10 to the vector memory 12. In another embodiment, the information detector 172 may detect the information of the sub routine 30b by reading out the instruction stored in the vector memory 12.

The address expander 174 outputs the address which appoints the test pattern and the expected value pattern stored in the pattern memory, based on the vector instructions stored in the vector memory 12. The transfer controller 178 reads out the test pattern and the expected value pattern from the pattern memory, based on the address supplied from the address expander 174, to write on the main test pattern cache memory 180 or the sub test pattern cache memory 182. For example, when the address expander 174 supplies the addresses A1, A2 and A3 to the transfer controller 178 based on the sub routine 12b, the transfer controller 178 reads out from the pattern memory 32 the test patterns D1, D2 and D3 respectively appointed by the addresses A1, A2 and A3, and writes on the sub test pattern cache memory 182.

The output unit 184 outputs the test patterns and the expected value patterns stored in the main test pattern cache memory 180 and the sub test pattern cache memory 182, to the pin data selector 66. The output unit 184 may be, for example, a multiplexer for selecting either of the main test pattern cache memory and the sub test pattern cache memory.

Figure 14:
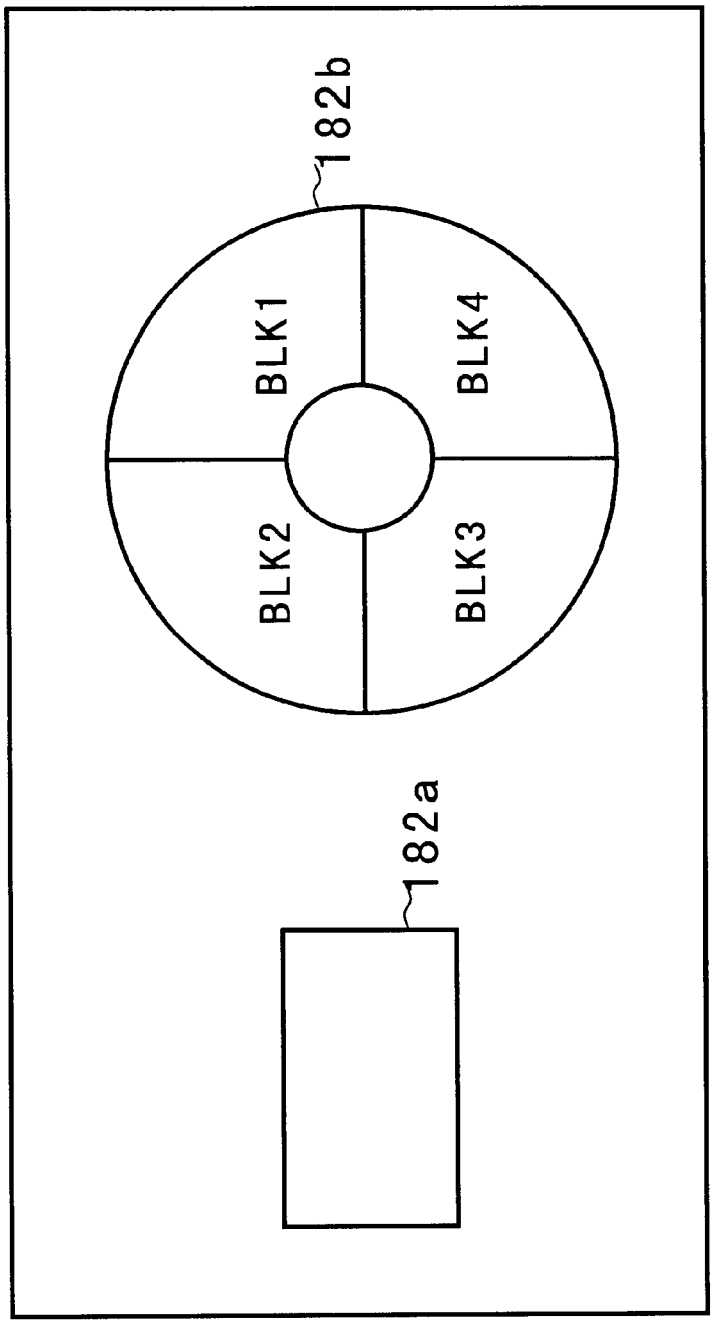
FIG. 14 is a block diagram of a sub test pattern cache memory 182.

FIG. 14 is a block diagram showing the sub test pattern cache memory 182. The sub test pattern cache memory 182 comprises a fixed buffer 182a having a predetermined capacity, and a ring buffer 182b. The transfer controller 178 stores the test pattern and the expected value pattern in the fixed buffer 182 a and the ring buffer 182 b, based on the information of the sub routine supplied from the information detector 172.

Figure 15:
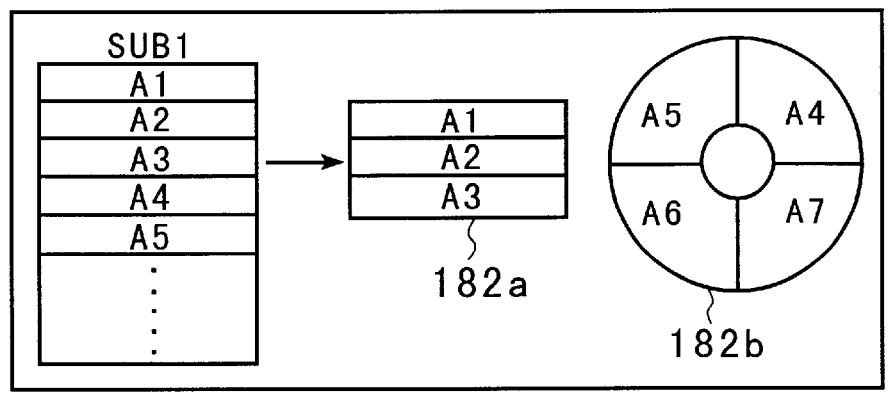
FIG. 15(a) shows a sub routine stored in the sub test pattern cache memory 182 when there is one sub routine 12b.
FIG. 15(b) shows a sub routine stored in the sub test pattern cache memory 182 when there is a plurality of sub routine 12b.
FIG. 15(c) shows a sub routine stored in the sub test pattern cache memory 182 when there is a plurality of sub routine 12b.
Figure 15:
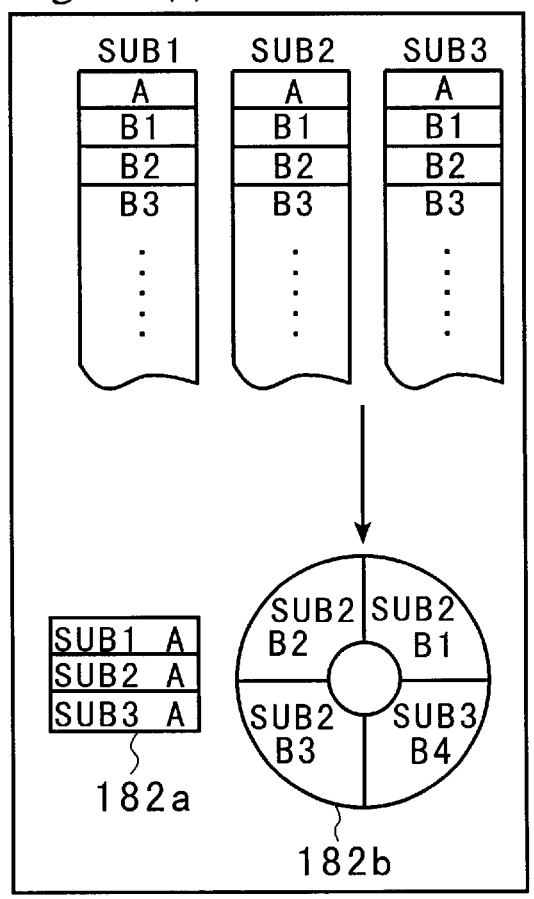
Figure 15:
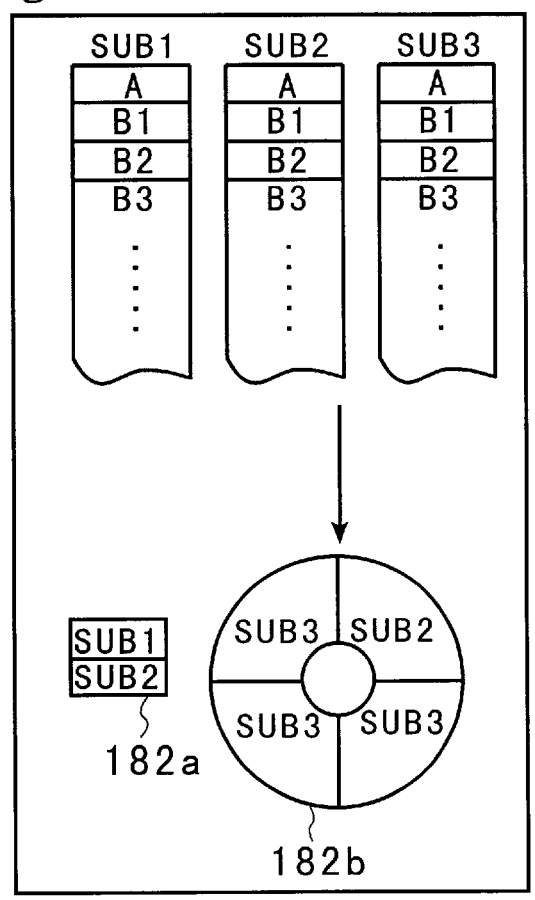

FIG. 15(a) shows the sub routine stored in the sub test pattern cache memory 182 when there is one sub routine 12b. The test pattern and the expected value pattern read out by the sub routine SUB1 is referred to as a sub routine pattern SUB1. When the sub routine pattern SUB1 is divided into A1, A2, A3 . . . each having a predetermined capacity, the first part of the sub routine pattern SUB1, A1, A2 and A3, are stored in the fixed buffer 182a, and the next part of the sub routine, A4, A5, A6 and A7 are stored in the ring buffer 182b. The remainder of the sub routine, from A8, is stored in order, with the output of the test patterns and the expected value patterns stored in the ring buffer 182b.

Thus, the capacity of the test pattern and the expected value pattern read out in accordance with the sub routine 12b is not limited. When the sub routine SUB1 is read out by the main routine, the test pattern and the expected value pattern previously stored in the fixed buffer 182a are output. While the test patterns and the expected value patterns stored in the fixed buffer are being output, the transfer controller 178 stores the remainder of the sub routine SUB1, from A4, in each of the blocks of the ring buffer 182.

The first part of the sub routine pattern SUB1 is always stored in the fixed buffer 182a. Even when the sub routine SUB1 is read out, the test pattern and the expected value pattern are immediately output. Therefore, the fixed buffer 182a preferably stores the test pattern 32a and the expected value pattern 32b in a manner such that the time required for reading out the test pattern and the expected value pattern stored in the fixed buffer 182a is longer than the time required for storing the test pattern and the expected value pattern in the ring buffer 182b.

FIG. 15(b) shows the sub routine 12b stored in the sub test pattern cache memory 182 when there are a plurality of sub routines. The test pattern and the expected value pattern read out by the sub routine SUB1, SUB2 and SUB3 are respectively referred to as sub routine patterns SUB1, SUB2 and SUB3. Each of the sub routine patterns SUB1, SUB2 and SUB3 are divided into A, B1, B2, B3 . . . , each having a predetermined capacity. The first part of each of the sub routine patterns SUB1, SUB2 and SUB3, "A" in this case, is stored in the fixed buffer 182a.

The ring buffer 182 b stores each of the divided sub routines in order, every time the sub routine is read out by the main routine. For example, when the sub routine SUB2 is read out by the main routine, the test pattern and the expected value pattern of part "A" of the sub routine pattern SUB2 previously stored in the fixed buffer 182a are output. While the test pattern and the expected value pattern stored in the fixed buffer are being output, the transfer controller 178 stores B1, B2, B3 and B4 of the sub routine pattern SUB2 in each of the blocks of the ring buffer 182b. The rest of the divided sub routines from B5 are stored in order, with the test pattern and the expected value pattern stored in the ring buffer being output. Therefore, the capacities of the test pattern and the expected value pattern read out, based on the sub routine 12b are not limited.

Furthermore, when the sub routine 12b comprises a plurality of sub routines, and the sub routine SUB2 is read out immediately after the sub routine SUB1 is readout, the test pattern and the expected value pattern can be output without delay. This is because the test pattern and expected value pattern read out at the first part of each of the sub routines are stored in the fixed buffer 182a. The part A of each of the sub routine patterns stored in the fixed buffer 182a preferably stores the test pattern and the expected value pattern in such a manner that the time required for reading out the test pattern and the expected value pattern is longer than the time required for storing the test pattern and the expected value pattern in the ring buffer 182b.

FIG. 15(c) shows the sub routine 12b stored in the sub test pattern cache memory 182, when there are a plurality of sub routines. When the capacity of the test pattern and expected value pattern read out by the plurality of the sub routine is smaller than the capacity of the fixed buffer 182a and ring buffer 182b, the ring buffer 182b can be used as the fixed buffer 182b. The fixed buffer 182a stores the sub routine SUB1 and a part of the sub routine SUB2. The ring buffer 182b stores a part of the sub routine SUB2 and the sub routine SUB3.

As described with reference to FIG. 15(a) and (b), the test pattern and the expected value pattern are temporarily stored without limiting the length of and the number of the sub routine, because the sub test pattern cache memory 182 comprises the fixed buffer 182 a and the ring buffer 182b.

Figure 16:
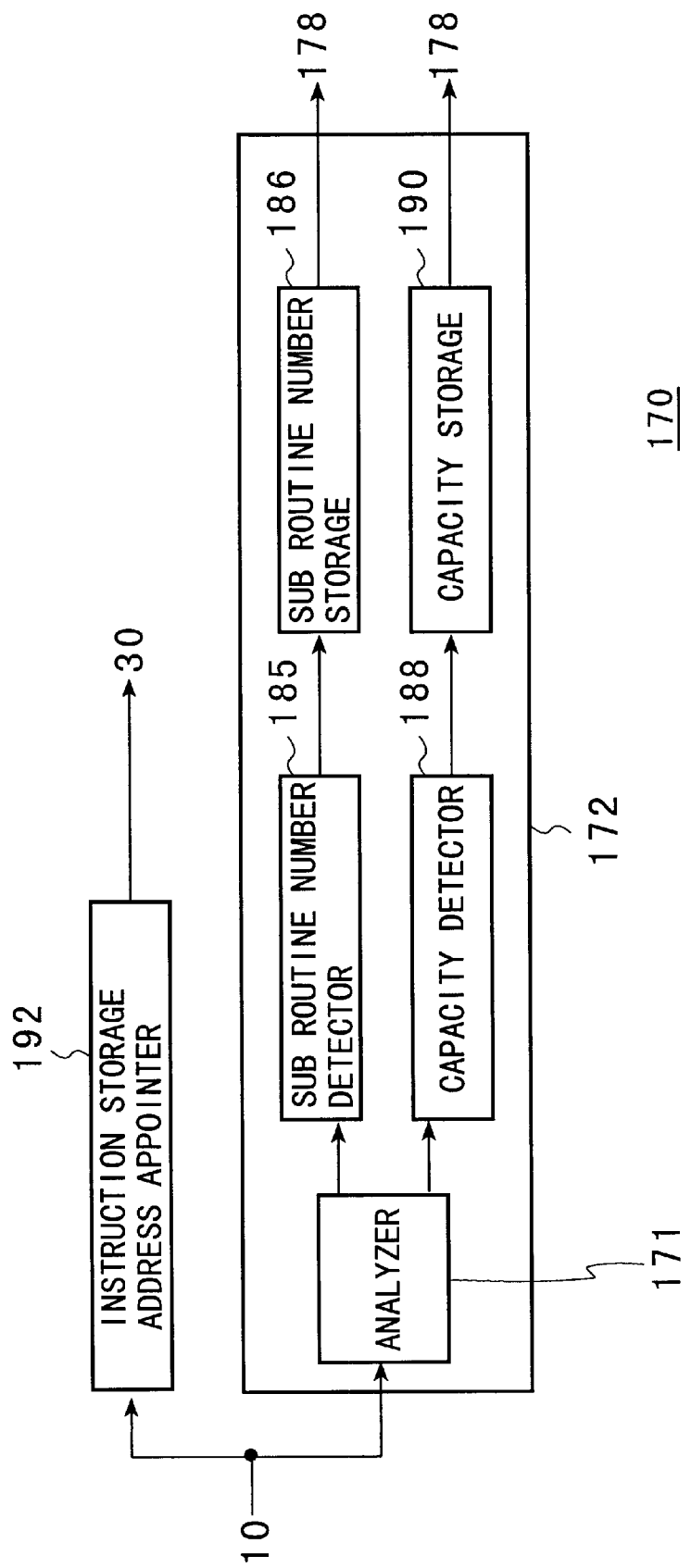
FIG. 16 is a block diagram of an embodiment of the read out controller 170.

FIG. 16 is a block diagram of an embodiment of the read out controller 170. The read out controller 170 comprises an instruction storage address appointer 192 and information detector 172. The information detector 172 comprises an analyzer 171, a sub routine number detector 185, a sub routine number storage 186, a capacity detector 188 and a capacity storage 190. The instruction storage address appointer 192 stores the vector instruction supplied from the external memory 10 in the address appointed by the vector memory 12. The analyzer 171 respectively outputs an opecode and an operand included in the vector instruction to the sub routine number detector 185 and the capacity detector 188. The sub routine number detector 185 detects the number of the sub routines included in the vector instruction supplied from the external memory 10 based on the opcode supplied from the analyzer 171. The sub routine number detector 185 then outputs the detected result to the sub routine number storage 186. The sub routine number storage 186 outputs the number of the sub routines to the transfer controller 178.

The capacity detector 188 detects the capacity of the test pattern and the expected value pattern read out by the sub routine included in the vector instruction supplied from the external memory 10, based on the opcode and the operand supplied from the analyzer 171. The capacity detector 188 then outputs the detected result to the capacity storage 190. The capacity storage 190 outputs the capacity to the transfer controller 178. For example, the capacity detector 188 may detect the capacity of the test pattern and expected value pattern read out by the sub routine by subtracting the start address from the end address of the test pattern and expected value pattern stored in the pattern memory 32.

FIG. 17(a) shows an example of the vector instructions supplied from the external memory 10. The line number 10 to the line number 20 are main routine and stored in the main routine 12a. The line number 21 to the line number 26 are sub routine and stored in the sub routine 12b. In this embodiment, an instruction includes an opcode and a plurality of operands.

In the line number 10, the word "STRT:" is a label and the opcode "IDXI" is an instruction to output the same address for the number of times indicated by the operands. The operand "2" is related to opcode "IDXI", and indicates that the same address is output for 2 cycles. The line number 11 is an instruction that the same address is to be output for 2 cycles.

In the line number 12, the opcode "JSR" is an instruction to jump to the sub routine indicated by the operand "SUB1". Only one opcode is shown in FIG. 17(a) which is the address at which the sub routine SUB1 of the vector memory 12, and the address of the test pattern and the expected value pattern read out by the sub routine SUB1 in the pattern memory 32 are written. The line number 13 is an instruction to jump to sub routine SUB1.

In line number 14, the opcode "STI" is an instruction appointing the number of the loops. The number of the loops is set as "3" appointed by the operand. In line number 15, "LOOP1:" is a label, and the opcode "IDXI 4" is an instruction to output the same address for four, cycles. The line number 16 is an instruction to jump to the sub routine SUB1. The line number 17 is an instruction to output the same address for four cycles.

In line number 18, the opcode "JNI" is an instruction to repeat the instruction of the label "LOOP1" to line number 17. The repeating number is set as the number appointed in line number 14. Therefore, line number 15 to line number 18 are repeated three times. The line number 19 is an instruction that the same address is output eight times. The line number 20 is an instruction to terminate output of the test pattern and the expected value pattern.

In line number 21, "SUB1" is a label and this address is a start address of the sub routine. The line number 22 to line number 24 are instructions to repeat line number 23 and line number 24 twice. The line number 25 is an instruction to output the same address for four cycles. In line number 26, the opcode "RTN" indicates the end of the sub routine and is an instruction to return to the next line number of the line number at which the sub routine is read out. For example, when the sub routine SUB1 is read out by the opcode "JSR" of line number 13, the instruction returns to line number 14 by the opcode "RTN" on line number 26.

FIG. 17(b) shows an example of the instructions including three sub routines. The line number 10 to line number 21 is the main routine. The line number 22 to line number 27 is the sub routine SUB1. The line number 28 to line number 30 is the sub routine SUB2. The line number 31 is the sub routine SUB3. The explanation of the instructions for each of the lines is omitted.

Figure 18:
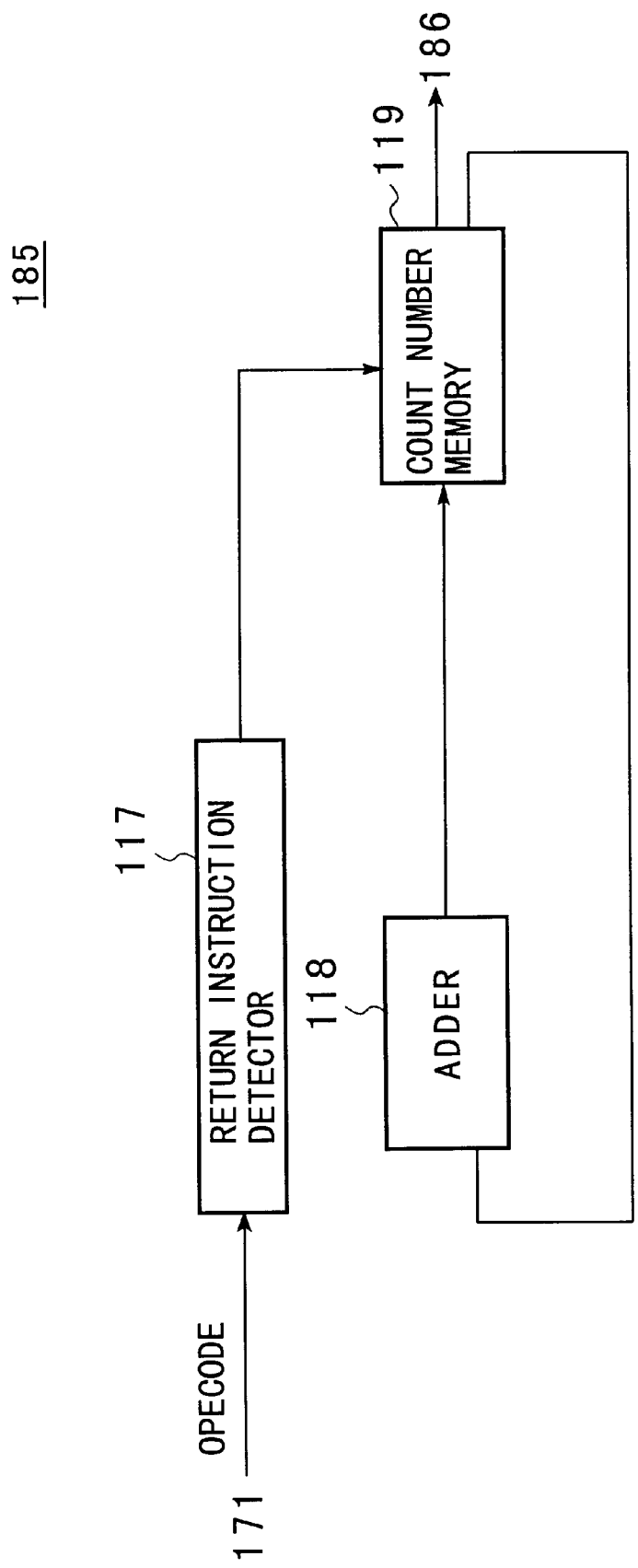
FIG. 18 is a block diagram of an embodiment of the sub routine number storage 186.

FIG. 18 is a block diagram of an embodiment of the sub routine number detector 185. The sub routine number detector 185 comprises a return instruction detector 117, an adder 118 and a count number memory 119. The return instruction detector 117 has the count number memory 119 store the value supplied from the adder 118 when the opcode supplied from the analyzer 171 is the return instruction "RTN". The adder 118 always adds 1 to the value stored in the count number memory 119. This means that the number of sub routines stored in the count number memory 119 is increased every time the return instruction detector 117 detects the return instruction "RTN".

The operation of the sub routine number detector 185 will be explained with reference to FIG. 17(b). The initial value of the count number memory 119 is set as "0". When the return instruction detector 117 detects the opcode "RTN" of the line number 27, the return instruction detector 11 has the count number memory 119 store the value supplied from the adder 118. The adder 118 outputs the value "1" to the count number memory 119 at this time, for storage there. When the value "1" is stored in the count number memory 119, the adder 118 then outputs the value "2" to the count number memory 119. When the count number memory 119 detects the opcode "RTN" of line number 30, the count number memory 119 stores the value "2". When the count number memory 119 detects the opcode "RTN" of line number 31, the count number memory 119 stores the value "3". Thus, the sub routine number detector 185 can detect the number of sub routines.

Figure 19:
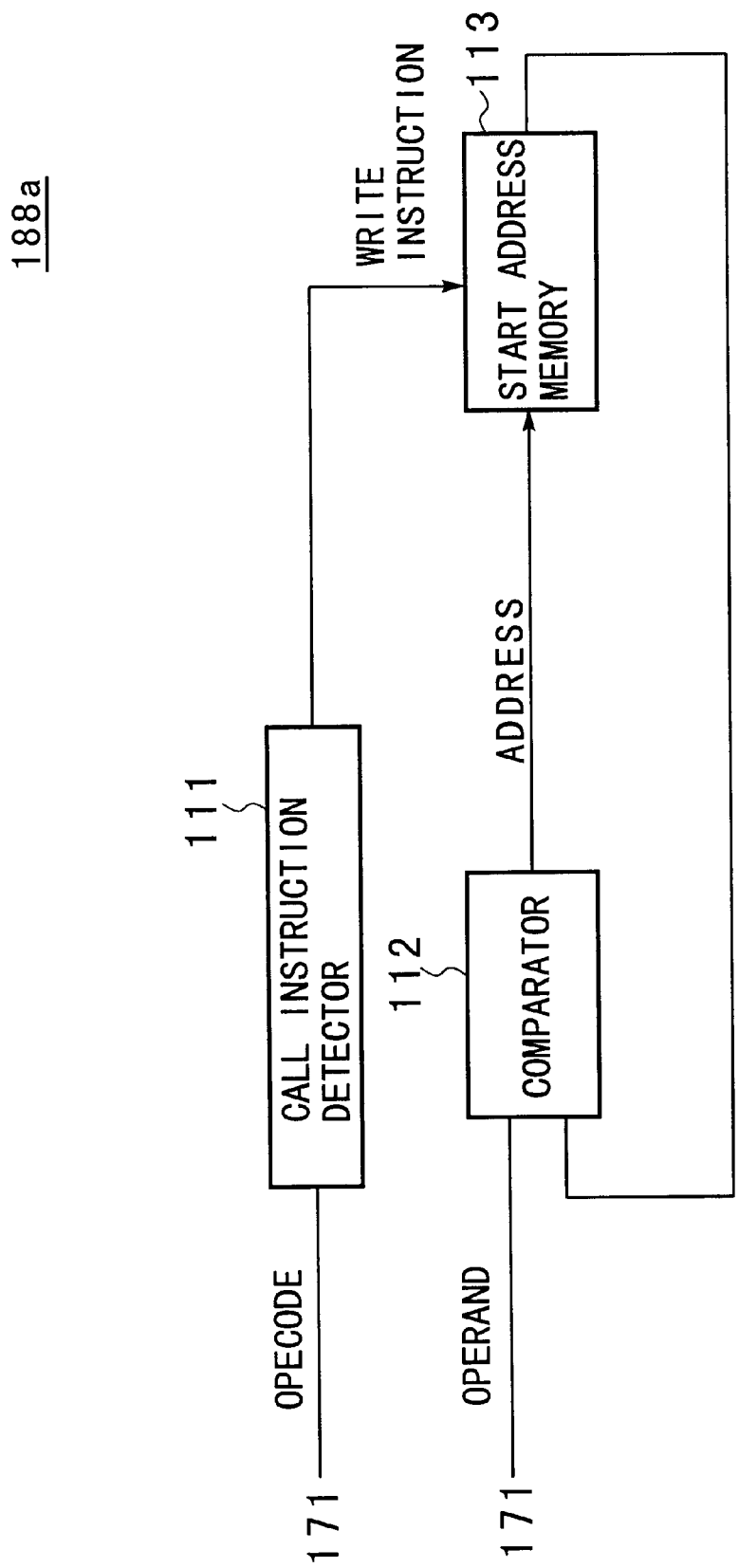

FIG. 19 is a block diagram of an embodiment of the start address detector 188a. The start address detector 188a detects the smallest address of the test pattern and the expected value pattern read out by the sub routine 12*b*. The start address detector 188*a* comprises a read out instruction detector 111, a comparing unit 112 and a start address memory 113. The comparing unit 112 compares the operand (address) supplied from the analyzer 171 and the address supplied from the start address memory 113, and outputs the smaller address to the start address memory 113. The read out instruction detector 111 has the start address memory 113 store the address supplied from the comparing unit 112 when the read out instruction detector 111 detects the opecode "JSR". This means that the sub routine is to be read out, supplied from the analyzer 171. Therefore, the start address memory 113 can store the start address of the test pattern and the expected value pattern read out by the sub routine.

The operation of the start address detector 188*a* will be explained with reference to FIG. 17(*b*). The pattern memory 32 preferably stores the test pattern and expected value pattern in the following order:, the test pattern and expected value pattern read out by the sub routine SUB1, the test pattern and expected value pattern read out by the sub routine SUB2, and the test pattern and expected value pattern read out by the sub routine SUB3.

The initial value of the start address memory 113 is set at the maximum address possible for the pattern memory 32. For example, all the bits are set for 1. In line number 12 (**), the comparing unit 112 compares the maximum address stored in the start address memory 113 and the address of the sub routine SUB3 supplied from the analyzer 171. The comparing unit 112 outputs the smaller address which is the address of the sub routine SUB3 in this case, to the start address memory 113. The read out instruction detector 111 has the start address memory 113 store the address of the sub routine SUB3 supplied from the comparing unit 112.

In line number 13, the comparing unit 112 compares the address of the sub routine SUB3 stored in the start address memory 113, and the address of the sub routine SUB1 supplied from the analyzer 171. The comparing unit 112 then outputs the smaller address which is the address of the sub routine SUB1 in this case, to the start address memory 113. The read out instruction detector 111 has the start address memory 113 store the address of the sub routine SUB1 supplied from the comparing unit 112.

In the line number 16, the comparing unit 112 compares the address of the sub routine SUB1 stored in the start address memory 113, and the address of the sub routine SUB2 supplied from the analyzer 171. The comparing unit 112 when outputs the smaller address which is the address of the sub routine SUB1 in this case, to the start address memory 113. The read out instruction detector 111 has the start address memory 113 store the address of the sub routine SUB1 supplied from the comparing unit 112.

In line number 19, the comparing unit 112 compares the address of the sub routine SUB1 stored in the start address memory 113, and the address of the sub routine SUB3 supplied from the analyzer 171. The comparing unit 112 then outputs the smaller address which is the address of the sub routine SUB1 in this case, to the start address memory 113. The read out instruction detector 111 has the start address memory 113 store the address of the sub routine SUB1 supplied from the comparing unit 112. The opecode "JSR", which means to read out the sub routine, is not included in the instructions after line number 20. The address of the sub routine SUB1 is maintained in the start address memory 113.

Figure 20:
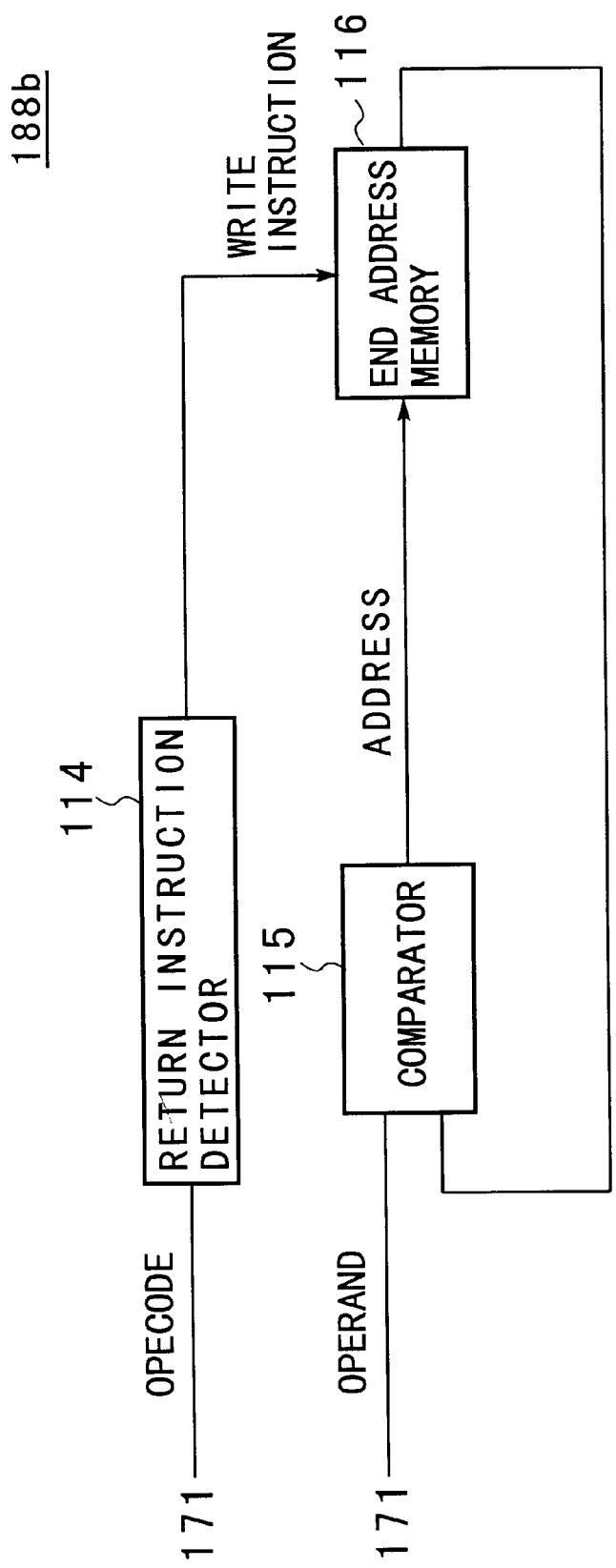
FIG. 20 is a block diagram of an embodiment of the end address detector 188b.

FIG. 20 is a block diagram of an embodiment of the end address detector 188*b*. The end address detector 188*b* detects the largest address of the test pattern and the expected value pattern read out by the sub routine 12*b*. The end address detector 188*b* comprises a return instruction detector 114, a comparing unit 115 and an end address memory 116. The comparing unit 115 compares the operand (address) supplied from the analyzer 171 and the address supplied from the start address memory 113. The comparing unit 115 then outputs the larger address to the start address memory 113. The return instruction detector 114 has the end address memory 116 store the address supplied from the comparing unit 115 when the return instruction detector 114 detects the opecode "RTN". This is the return instruction of the sub routine, supplied from the return instruction analyzer 171. Therefore, the end address memory 116 can store the end address of the test pattern and the expected value pattern read out by the sub routine.

The operation of the end address detector 188 b will be explained with reference to FIG. 17(*b*). The pattern memory 32 preferably stores the test pattern and the expected value pattern in the following order: the test pattern and the expected value pattern read out by the sub routine SUB1, the test pattern and the expected value pattern read out by the sub routine SUB2, and the test pattern and the expected value pattern read out by the sub routine SUB.

The initial value of the end address memory 116 is set at the smallest address possible for the pattern memory 32. For example, all the bits are set for "0". In line number 27, the comparing unit 115 compares the minimum address stored in the end address memory 116 and the address of line number 27 supplied from the analyzer 171. The comparing unit 115 outputs the larger address which is the address of line number 27 in this case, to the start address memory 113. The return instruction detector 114 has the end address memory 116 store the address of line number 27, which is the end address of the sub routine SUB1, supplied from the comparing unit 115.

In line number 30, the comparing unit 115 compares the end address of the sub routine SUB1 stored in the end address memory 116, the address of line number 27, and the address of line number 30 supplied from the analyzer 171. The comparing unit 115 outputs the larger address which is the address of line number 30, to the end address memory 116. The return instruction detector 114 has the end address memory 116 store the address of line number 30,which is the end address of the sub routine SUB2, supplied from the comparing unit 115.

In line number 31, the comparing unit 115 compares the end address of the sub routine SUB2 stored in the end address memory 116, the address of line number 30, and the address of line number 31 supplied from the analyzer 171. The comparing unit 115 outputs the larger address which is the address of line number 31, to the end address memory 116. The return instruction detector 114 has the end address memory 116 store the address of line number 31, which is the end address of the sub routine SUB3, supplied from the comparing unit 115. Therefore, the end address of the sub routine SUB3 is stored in the end address memory 116.

The capacity detector 188 detects the capacity of the test pattern and expected value pattern read out by the sub routine 12*b* by subtracting the address stored in the start address memory 113 from the address stored in the end address memory 116.

The transfer controller 178 stores the test pattern and expected value pattern in the fixed buffer 182 a and the ring buffer 182*b*, based on the numbers of the sub routines and the capacity of the sub routines detected by the information detector 172.

Although the present invention has been described by way of exemplary embodiments, it should be understood that the spirit and the scope of the present invention are not limited to the above described embodiments. It is obvious from the appended claims that many alterations and improvements can be made to the above described embodiments. Alterations include those explained in the following.

As for the first alteration, the sub test pattern cache memory 182 can be used as a cache device for temporarily storing and outputting a desired data. For example, the sub test pattern cache memory 182 may be used as a cache device for inputting and outputting data at a high speed in graphics processing for a computer game.

As for the second alteration, the test pattern generator may comprise a plurality of sub test pattern cache memories 182, and each of the sub test pattern cache memories 182 may respectively store each of the sub test patterns when the sub routine 30b includes the plurality of sub routines.

FIG. 21 shows an example of the vector instruction supplied from the external memory 10. The vector instruction comprises two sub routines SUB1 and SUB2. However, the vector instruction includes only one return instruction. Therefore, sub routine number detector 185 explained with reference to FIG. 18 cannot detect the two sub routines.

Figure 22:
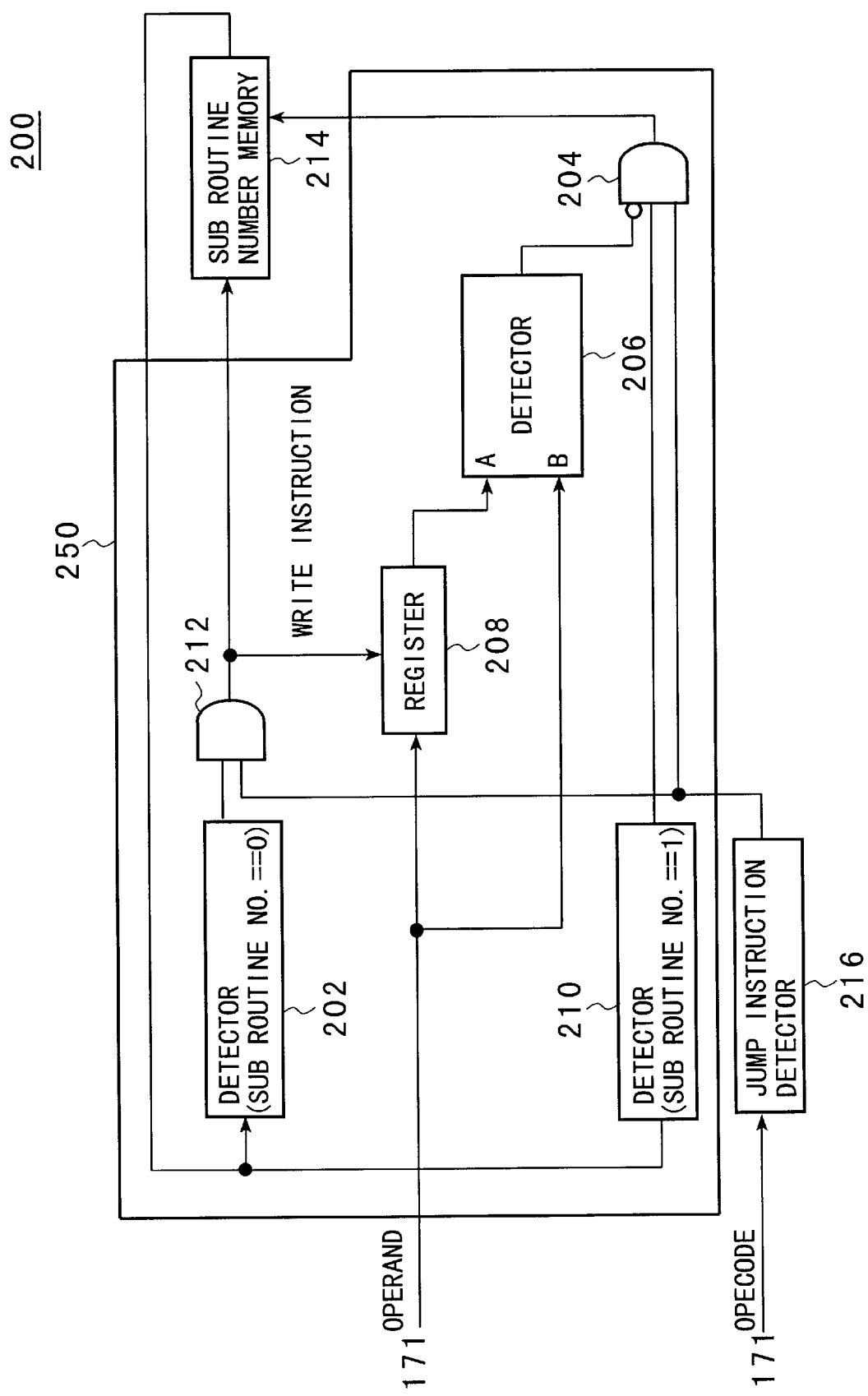
FIG. 22 is a block diagram of an embodiment of the sub routine number detector 200.

As for the third alteration, the sub routine number detector 185 shown in FIG. 18 may detect the number of sub routines based on the jump instruction. FIG. 22 shows a sub routine number detector 200 which is the alteration of the sub routine number detectors 185 and 186. The sub routine number detector 200 comprises a judging unit 250, a sub routine number storage 214 and a jump instruction detector 216. The judging unit 250 comprises identical detectors 202, 210 and 206, an AND circuit 204 and 212 and a register 208.

The sub routine number storage 214 stores the number of sub routines. For example, the sub routine number storage 214 may be a counter that counts in accordance with the supplied logic value 1. The identical detector 202 outputs the logic value 1 to the AND circuit 212 when the value stored in the sub routine number storage 214 is 0. The identical detector 210 outputs the logic value 1 to the AND circuit 204 when the value stored in the sub routine number storage 214 is 1. The register 208 stores the operand supplied from the analyzer 171 when the write instruction, the logic value 1, is supplied from the AND circuit 212. The identical detector 206 compares the operand stored in the register 208 and the operand supplied from the analyzer 171 and judges whether or not these are the same.

The jump instruction detector 216 detects whether or not the opcode supplied from the analyzer 171 is the jump instruction "JSR" and outputs the result to the AND circuits 212 and 204. For example, the jump instruction detector 216 outputs the logic value 1 when it detects the jump instruction. The AND circuit 204 outputs the reversed output value of the identical detector 206, and the logic product of the output values of the identical detector 210 and the jump instruction detector 216 to the sub routine number memory 214.

The sub routine number memory 214 initializes the count value as 0 before detecting the information of the sub routine 30b. Therefore, the identical detector 202 outputs the logic value 1 to the AND circuit 212. When the jump instruction detector 216 detects the jump instruction "JSR", the start address of the sub routine is stored in the register 208. The sub routine number memory 214 increased the count value. Therefore, the sub routine number memory 214 can store 1 as the number of sub routines. When the jump instruction detector 216 detects the jump instruction again, the identical detector 206 detects that the operand stored in the register 208 and the operand supplied from the analyzer 171 are different, and outputs the logic value 0 to the AND circuit 204. The identical detector 210 and the jump instruction detector 216 supply the logic value 1 to the AND circuit 204. The AND circuit 204 then outputs the logic value 1 to the sub routine number memory 214. The sub routine number memory 214 increases the count value. Thus, the sub routine number memory 214 can store 2 as the number of sub routines. The sub routine number detector 200 can detect the number of sub routines even when the number of sub routines and the number of the return instructions are different as shown in FIG. 21.

Figure 23:
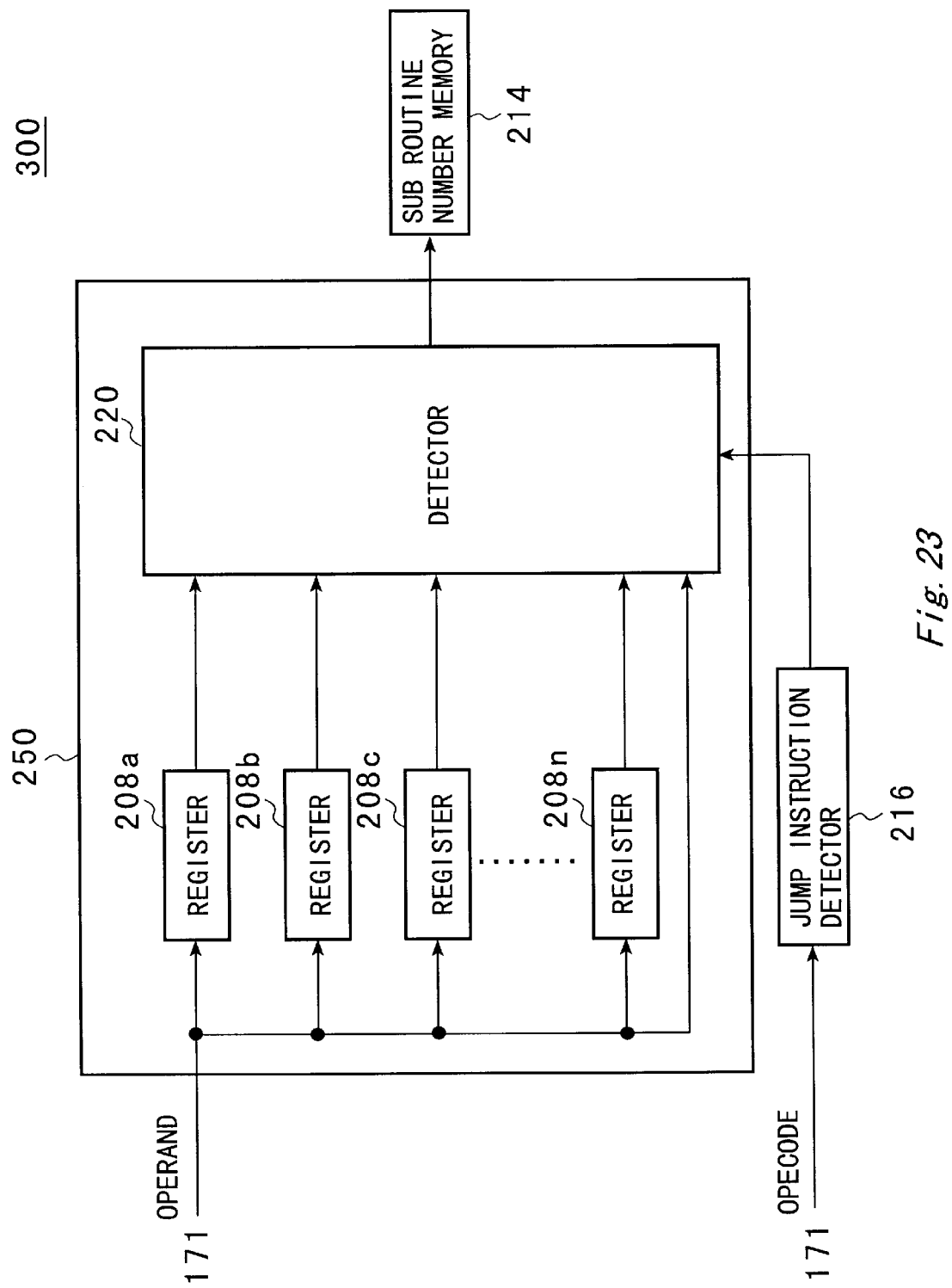
FIG. 23 is a block diagram of an embodiment of the sub routine number detector 300.

As for the fourth alteration, the sub routine number detector 200 may comprise a plurality of registers. FIG. 23 shows a sub routine number detector 300 comprising a plurality of registers. The sub routine number detector 300 comprises a judging unit 250, a jump instruction detector 216, and a sub routine number memory 214. The judging unit 250 comprises registers 208a to 208n and identical detector 220.

The jump instruction detector 216 outputs a identical signal when the jump instruction detector 216 detects the jump instruction, indicating to the identical detector 220 that the values are the same. The identical detector 220 compares the operand stored in each of the registers 208 a to 208n and the operand supplied from the analyzer 171. The identical detector 220 stores the operand supplied from the analyzer 171 to the register 208 a to 208n in which the operand is not stored yet, when the operand stored in the registers 208a to 208n and the operand supplied from the analyzer 171 are not the same. The sub routine number memory 214 increases the count value when the operand stored in the registers 208a to 208n and the operand supplied from the analyzer 171 are not the same.

The registers 208a to 208n and the sub routine number memory 214 are initialized as 0 before detecting the number of sub routines. When the jump instruction detector 216 detects the jump instruction, the identical detector 220 stores the operand supplied from the analyzer 171 to the register 208a. At the same time, the identical detector has the sub routine number memory 214 increase the count value. When the jump instruction detector 216 detects the jump instruction again, the identical detector 220 compares the operand stored in the register 208a and the operand supplied from the analyzer 171. When the compared operands are different, the identical detector 220 stores the operand supplied from the analyzer 171 to the register 208b, and has the sub routine number memory 214 increase the count value. The explanation of the remainder of the operation is omitted. By providing a plurality of registers, any number of sub routines greater than two can be detected.

As described above, a sub routine can be repeatedly executed even when a DRAM is used as a pattern memory. Therefore, the program is simplified. The result is that another program is transferred from a hard disk to the program at a high speed, and an electrical device is tested at a high speed. Furthermore, three vector memory banks are provided. Thus, the vector instruction stored in one of the vector memory banks can be expanded while the instruction to execute the sub routine is generated and the sub routine is started. At the same time, the test pattern can be transferred to the test pattern cache memory.

Although the present invention has been described by way of exemplary embodiments, it should be understood that many changes and substitutions may be made by those skilled in the art without departing from the spirit and the scope of the present invention which is defined only by the appended claims.

What is claimed:

1. A test pattern generator for generating a test pattern for testing electrical characteristics of an electrical device comprising:

a pattern memory for storing pattern data;

a vector memory for storing a vector instruction indicating an address order of said test pattern to be generated;

a read out controller for judging whether an address in said address order is to be jumped or not, said read out controller for outputting a signal including said address based on the judgment;

a transfer controller for controlling said pattern memory to transfer said pattern data stored in said pattern memory according to said signal including said address; and a pattern cache memory for temporarily storing said pattern data read out from said pattern memory, said pattern cache memory selectively outputting said pattern data stored in said pattern memory.

2. A test pattern generator as set forth in claim 1, wherein said test pattern comprises a main test pattern and a sub test pattern which is repeatedly incorporated in said main test pattern, and said pattern cache memory comprises a main test pattern cache memory for storing said main test pattern read out from said pattern memory and a sub test pattern cache memory for storing said sub test pattern read out from said pattern memory.

3. A test pattern generator as set forth in claim 2, wherein said read out controller comprises means for detecting an instruction to read out said sub test pattern, and said transfer controller comprises means for transferring said sub test pattern from said pattern memory to said sub test pattern cache memory when said read out controller detects said instruction to read out said sub test pattern.

4. A test pattern generator as set forth in claim 3 wherein said sub test pattern cache memory comprises:

a ring buffer capable of outputting said sub test pattern with successively updating said sub test pattern therein; and a fixed buffer capable of outputting said sub test pattern with storing said sub test pattern therein.

5. A test pattern generator as set forth in claim 4 wherein said vector instruction comprises a main routine for reading out said main test pattern from said pattern memory and a sub routine for reading out said sub test pattern from said pattern memory, said transfer controller stores a first part of said sub test pattern successively read out from said pattern memory by said sub routine, and said sub test pattern, which is read out by said sub routine from said pattern memory and which is not stored in said fixed buffer, is successively stored in said ring buffer and output from said ring buffer when said sub routine is executed.

6. A test pattern generator as set forth in claim 5 wherein said read out controller further comprises an information detector for detecting an information of said sub routine stored in said vector memory, and said transfer controller stores said sub test pattern in either of said fixed buffer and/or said ring buffer based on said information of said sub routine.

7. A test pattern generator as set forth in claim 6 wherein said information detector detects an information of said sub routine at a time when said vector instruction is being stored in said vector memory.

8. A test pattern generator as set forth in claim 2, wherein said main test pattern cache memory comprises two pattern memory banks, and said test pattern generator further comprises a main test pattern multiplexer for reading out said main test pattern previously stored in one of said pattern memory banks to provide said read out main test pattern to said electrical device while said main test pattern read out from said pattern memory is being transferred to the other of said pattern memory banks.

9. A test pattern generator as set forth in claim 2, wherein said sub test pattern cache memory comprises two pattern memory banks, and said test pattern generator further comprises a sub test pattern multiplexer for reading out said sub test pattern previously stored in one of said pattern memory banks to provide said read out sub test pattern to said electrical device while said sub test pattern read out from said pattern memory is being transferred to the other of said pattern memory banks.

10. A test pattern generator as set forth in claim 2 further comprising a vector cache memory for storing said vector instruction read out from said vector memory, and wherein said read out controller detects that said sub test pattern is to be generated at a time when said vector instruction read out from said vector memory is being transferred to said vector cache memory.

11. A test pattern generator as set forth in claim 2 wherein said read out controller further comprises means for detecting an end address of said sub test pattern; and said transfer controller transfers a new sub test pattern to be read out, which was detected by said read out controller after said sub test pattern of said end address detected by said read out controller is transferred, to said sub test pattern cache memory.

* * * * *